United States Patent
Akada

(10) Patent No.: US 9,268,739 B2
(45) Date of Patent: Feb. 23, 2016

(54) DATA ACQUISITION METHOD IN SUBSTRATE PROCESSING APPARATUS AND SENSOR SUBSTRATE

(75) Inventor: Hikaru Akada, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 583 days.

(21) Appl. No.: 13/700,251

(22) PCT Filed: May 31, 2011

(86) PCT No.: PCT/JP2011/062484
§ 371 (c)(1),
(2), (4) Date: Dec. 5, 2012

(87) PCT Pub. No.: WO2011/152396
PCT Pub. Date: Dec. 8, 2011

(65) Prior Publication Data
US 2013/0080099 A1   Mar. 28, 2013

(30) Foreign Application Priority Data

May 31, 2010  (JP) .................................. 2010-124773

(51) Int. Cl.
*H01L 21/67* (2006.01)
*G06F 17/00* (2006.01)
*H02J 17/00* (2006.01)

(52) U.S. Cl.
CPC .......... *G06F 17/00* (2013.01); *H01L 21/67253* (2013.01); *H02J 17/00* (2013.01)

(58) Field of Classification Search
CPC ................................................ H01L 21/67253
USPC .............................................................. 702/81
See application file for complete search history.

(56) References Cited

U.S. PATENT DOCUMENTS 6,734,027 B2     5/2004  Jonkers
7,151,366 B2 *  12/2006  Renken et al. ........... 324/750.02
(Continued)

FOREIGN PATENT DOCUMENTS

JP    2003-045954 A1    2/2003
JP    2007-157896 A1    6/2007
(Continued)

OTHER PUBLICATIONS

International Search Report dated Aug. 23, 2011 (with English translation).

*Primary Examiner* — Bryan Bui
(74) *Attorney, Agent, or Firm* — Burr & Brown, PLLC

(57) ABSTRACT

A method that acquires data on a processing module of a substrate processing apparatus using a sensor substrate efficiently and highly precisely is provided. The method includes: holding a sensor substrate by a first holding member, the sensor substrate having a sensor section for acquiring data on the processing modules and a first power supply section with a rechargeable electricity storage section for supplying electric power to the sensor section; advancing the first holding member to transfer the sensor substrate to a processing module; acquiring data on the processing module by the sensor section of the sensor substrate; and causing the first holding member to receive the sensor substrate, whose electric charge is consumed, from the processing module and retract, and with that state, charging the first power supply section of the sensor substrate in a non-contact manner by a second power supply section that moves together with the base.

20 Claims, 24 Drawing Sheets

(56) References Cited

U.S. PATENT DOCUMENTS

2006/0222480 A1* 10/2006 Duhamel et al. ........... 414/744.8
2008/0102200 A1   5/2008 Doki et al.
2008/0102209 A1   5/2008 Sasaki et al.

FOREIGN PATENT DOCUMENTS

| JP | 2007-266079 A1 | 10/2007 |
| JP | 2008-109027 A1 | 5/2008 |
| JP | 2008-112751 A1 | 5/2008 |

* cited by examiner

DATA ACQUISITION METHOD IN SUBSTRATE PROCESSING APPARATUS AND SENSOR SUBSTRATE

TECHNICAL FIELD

The present invention relates to a data acquisition method in a substrate processing apparatus having a plurality of modules. It also relates to a sensor substrate used for the data acquisition method.

BACKGROUND ART

In a photoresist process, which is one of semiconductor manufacturing processes, a resist is coated on the surface of a semiconductor wafer which is a substrate (hereinafter referred to as a wafer), the resist is then exposed to a predetermined light pattern, and then the resist is developed, so that a resist pattern is formed. The resist pattern is formed by using a coating and developing apparatus having various modules for performing various processes to the wafer.

To process the wafer accurately without defects, it is necessary to acquire data on each module before operating the coating and developing apparatus or during its inspection. For example, a liquid processing module, which applies a chemical liquid, such as the resist, to the wafer, is provided with a spin chuck that retains, by suction, the central part of the back surface of the wafer and rotates the wafer. Therefore, the chemical liquid supplied to the rotation center of the wafer spreads by centrifugal force. A pre-operational inspection is conducted to locate the rotation center of the spin chuck for the purpose of forming a highly uniform film of the chemical liquid. When the wafer is to be processed, the wafer is placed on the spin chuck in such a manner that the center of the wafer coincides with the rotation center of the spin chuck. In a heating module that thermally processes a wafer, the data on wafer heating temperature is acquired.

To acquire the above-described data, a sensor wafer on which various sensors are mounted is used. For example, the sensor wafer, which is wire-connected to a power supply section, is loaded into an inspection target module to acquire the data. However, if the sensor wafer is connected to the power supply section by a wire, it is troublesome for an operator to load the sensor wafer into the inspection target module. As a solution to this problem, it is proposed that the power supply section formed, for instance, by a lithium-ion secondary battery be mounted on the sensor wafer. Thus, the wafer can be loaded into the module by a substrate transport mechanism included in the coating and developing apparatus. This makes it possible to increase the efficiency of data acquisition. An inspection conducted with the sensor wafer having the power supply is described in JP2008-109027A.

However, the coating and developing apparatus includes many modules in order to increase its throughput. In order to perform measurements in all the modules for a predetermined period of time, a large-capacity battery, which is large-sized and heavy, is required. If such a battery is used, environmental conditions prevailing in a processing module into which the sensor wafer is loaded differ from the environmental conditions prevailing when a product wafer is loaded. This may decrease the accuracy of acquired data.

SUMMARY OF THE INVENTION

The present invention provides a technology that makes it possible to accurately and efficiently acquire the data on each processing module included in a substrate processing apparatus.

The present invention provides a method of acquiring data in a substrate processing apparatus including a carrier block to which a carrier storing therein a plurality of substrates is carried, a plurality of processing modules that process substrates which are carried therein from the carrier block, and a substrate transport mechanism that transports the substrates between the processing modules, the substrate transport mechanism having a base and a first holding member mounted to the base to advance and retract, said method comprising the steps of: holding a sensor substrate by the first holding member, the sensor substrate having a sensor section for acquiring data on the processing modules and a first power supply section with a rechargeable electricity storage section for supplying electric power to the sensor section; advancing the first holding member to transfer the sensor substrate to a processing module; acquiring data on the processing module by the sensor section of the sensor substrate; and causing the first holding member to receive the sensor substrate, whose electric charge is consumed, from the processing module and retract, and with that state, charging the first power supply section of the sensor substrate in a non-contact manner by a second power supply section that moves together with the base.

The following specific embodiments (a) to (g) are applicable to the aforementioned method.

(a) The electricity storage section is constituted by an electric double-layer capacitor, a nano-hybrid capacitor, a lithium-ion capacitor, or other capacitor that stores electricity by storing an electrical charge.

(b) The substrate transport mechanism has a second holding member provided to hold a substrate and configured to advance and retract with respect to the base; and the second power supply section is provided in a charging substrate that charges the first power supply section and that is held by the second holding member.

(c) The step of charging the first power supply section of the sensor substrate includes a step of charging the sensor substrate while the sensor substrate is positioned relative to a power feeding substrate in such a way that a power receiving coil, connected to a circuit for charging the first power supply section, provided in the sensor substrate and a power receiving coil provided in the charging substrate face each other.

(d) The second power supply section is provided in the base.

(e) The method includes a step of judging whether the sensor substrate held by a first substrate holding part is placed at a charging position at which the sensor substrate is to be charged by the second power supply section.

(f) The method includes a step of judging whether an amount of charge in the first power supply section is reached a predefined set value; and a step of stopping charging of the first power supply section when the amount of charge in the first power supply section is reached the predefined set value.

(g) The sensor substrate is provided with a light emitter that emits light by using electric power of the first power supply section; the method includes a step of stopping emitting light from the light emitter when the amount of charge in the first power supply section is reached the predefined set value; the base or the charging substrate is provided with a light receiver and paired with the light emitter; the method includes a step of receiving light from the light emitter by the light receiver; and judgment whether or not the amount of charge in the first power supply section is reached the predefined set value is performed based on light reception of the light receiver.

(h) The substrate processing apparatus is provided with a charging mechanism to charge the second power supply section of the charging substrate; and the method includes a step of charging the second power supply section by the charging mechanism in a non-contact manner.

According to another aspect of the present invention, there is provided a sensor substrate configured to be transported by a substrate transport device, the sensor substrate including: a sensor section that acquires data on a processing module; a transmission section that wirelessly transmits the data acquired by the sensor section; a power supply section having a rechargeable electricity storage section for supplying electric power to the sensor section and to the transmission section; and a plurality of power receiving coil sections that are connected to a circuit of the power supply section to receive electric power transmitted from outside and supply the electric power to the electricity storage section, wherein the power receiving coil sections are disposed along a flat surface of the sensor substrate.

The following specific embodiments (a) and (b) are applicable to the aforementioned sensor substrate.

(a) The electricity storage section is constituted by an electric double-layer capacitor, a nano-hybrid capacitor, a lithium-ion capacitor, or other capacitor that stores electricity by storing an electrical charge.

(b) The sensor substrate includes a detection section that detects a voltage of the power supply section or an electrical current flowing from the power supply section; and an output section that outputs a charge completion detection signal based on a detection result of by the detection section.

According to the present invention, it is possible to reduce the capacity of the power supply section provided in the sensor substrate transported between the processing modules by the substrate transport mechanism. Therefore, charging can be accomplished within a short period of time to reduce the time required for data acquisition. Further, the use of a small-capacity power supply section ensures that a sensor wafer is close to an actual wafer in thickness and weight. Therefore, an inspection can be conducted with high accuracy.

DETAILED DESCRIPTION OF THE INVENTION

Embodiments of the present invention will now be described with reference to the accompanying drawings.

First Embodiment

Figure 1:
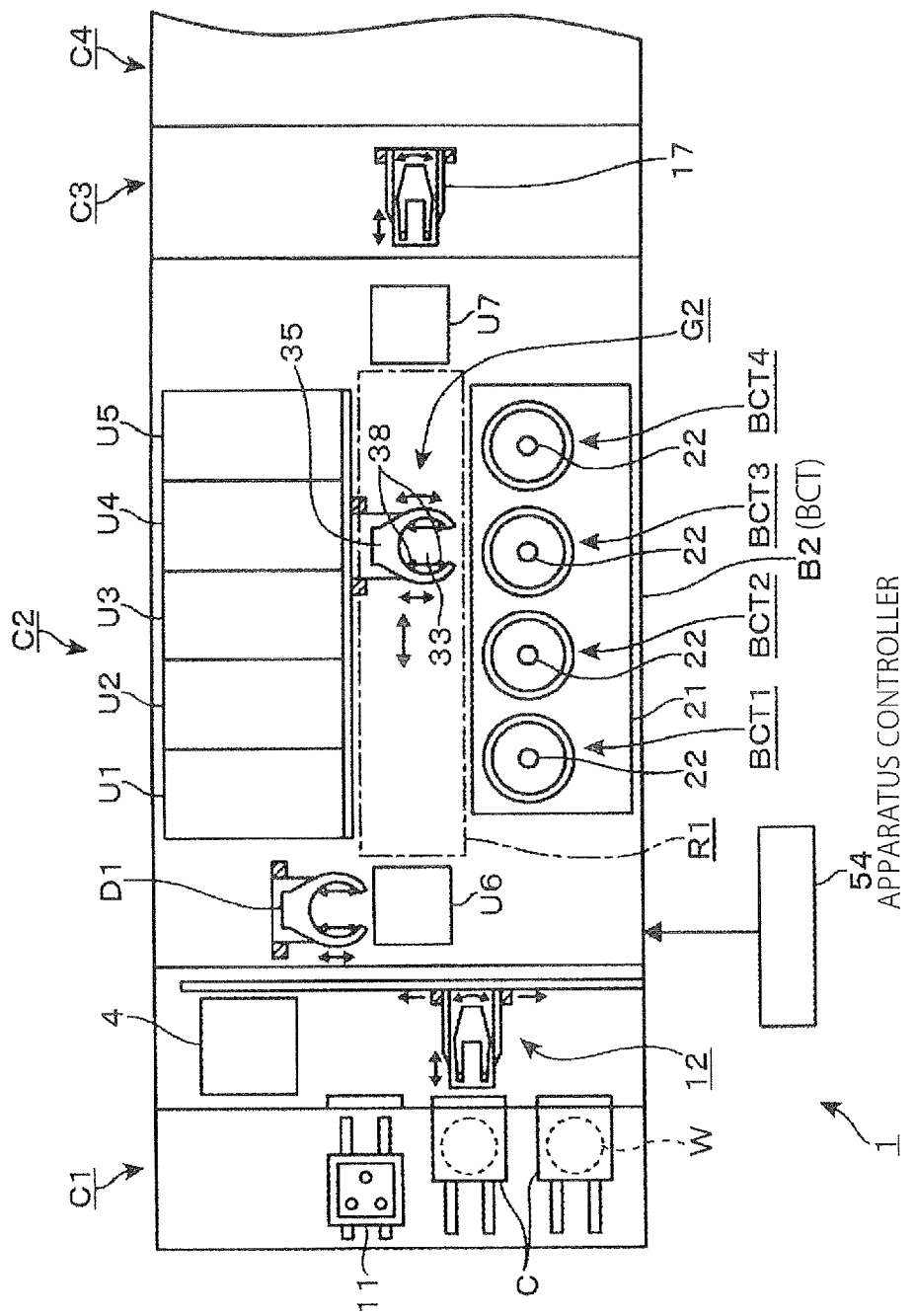
FIG. 1 is a plan view of a coating and developing apparatus as an example of a substrate processing apparatus.
Figure 2:
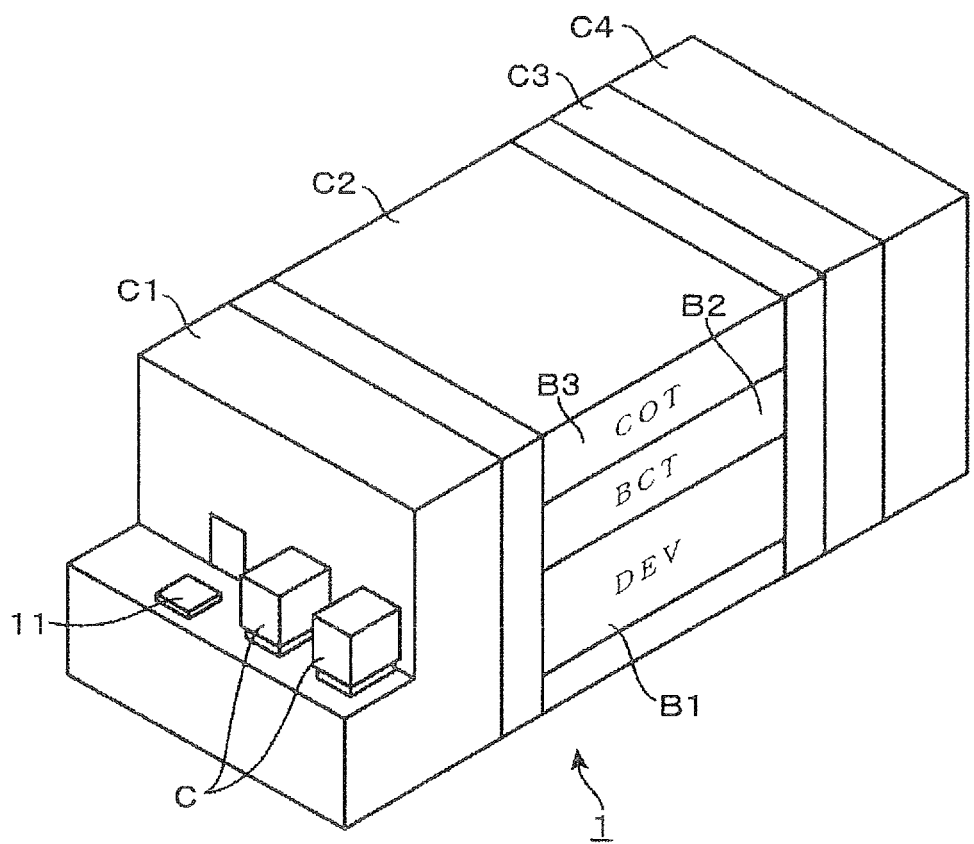
FIG. 2 is a perspective view of the coating and developing apparatus.
Figure 3:
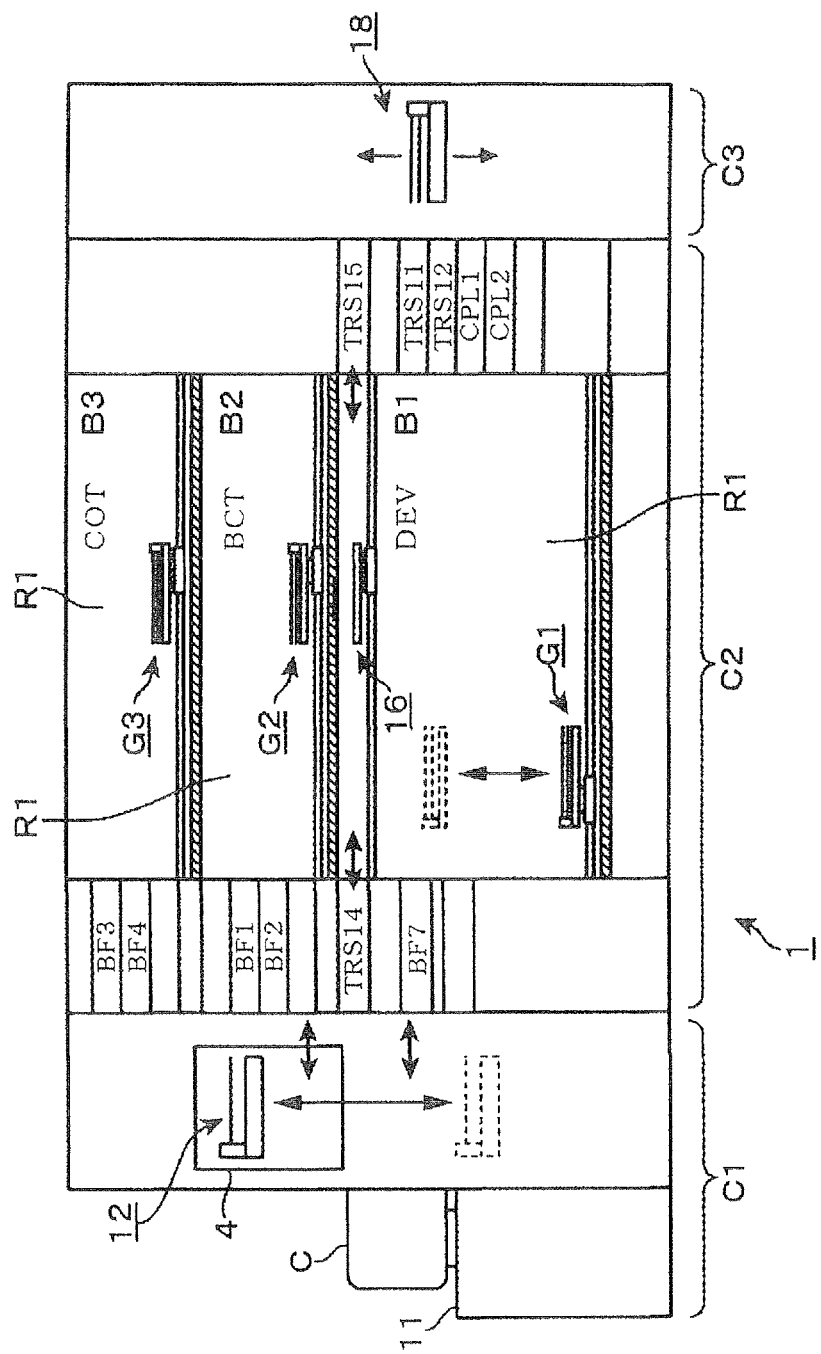
FIG. 3 is a vertically-sectioned side view of the coating and developing apparatus.

First of all, the configuration of a coating and developing apparatus, which is a substrate processing apparatus equipped with processing modules whose data is to be acquired by a data acquisition method, and a wafer transport path in the coating and developing apparatus 1 will be described. FIG. 1 is a plan view of a resist pattern forming system composed of the coating and developing apparatus 1 and an exposure device C5 connected to the coating and developing apparatus 1. FIG. 2 is a perspective view of the resist pattern forming system. FIG. 3 is a longitudinal cross-sectional view of the coating and developing apparatus 1.

The coating and developing apparatus 1 includes a carrier block C1. A transfer arm 12 removes a wafer W from a sealed carrier C, which is mounted on a mounting stage 11 of the carrier block C1, and transfers the removed wafer W to a processing block C2. Further, the transfer arm 12 receives a processed wafer W from the processing block C2 and returns the processed wafer W to the carrier C.

As shown in FIG. 2, the processing block C2 includes a first block (DEV layer) B1 for performing a development process, a second block (BCT layer) B2 for forming an antireflective film which is an underlying layer of a resist film, and a third block (COT layer) B3 for forming a resist film, which are stacked in that order from the bottom.

Figure 4:
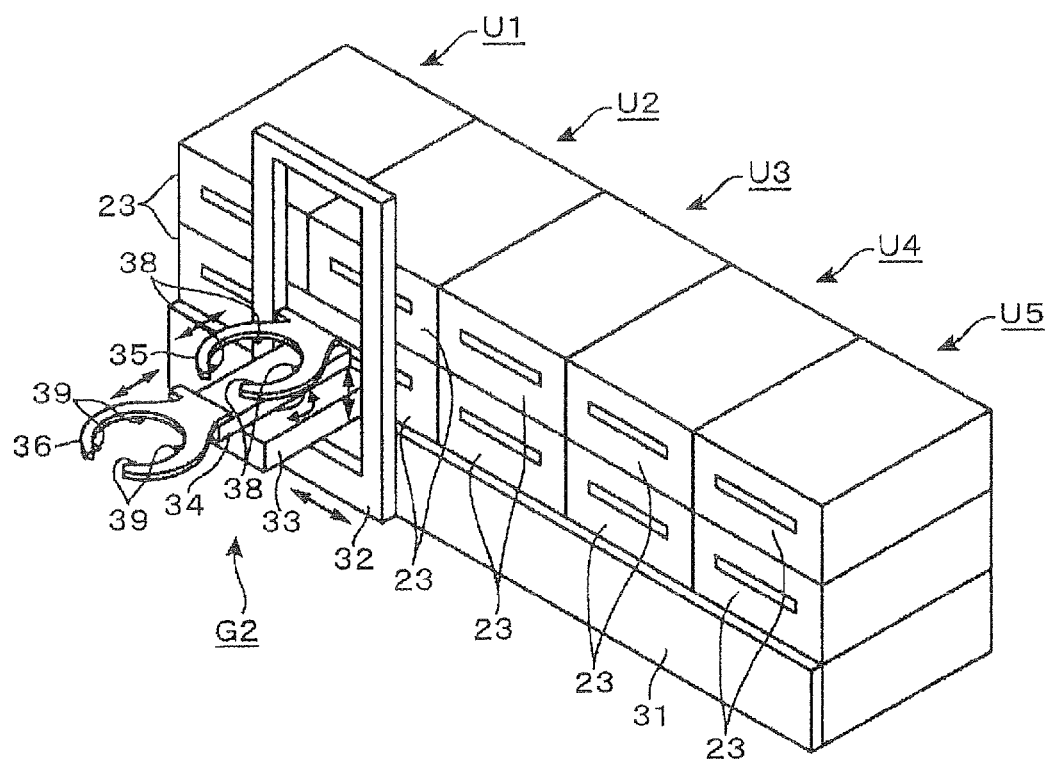
FIG. 4 is a perspective view illustrating a transport arm of the coating and developing apparatus.

The individual layers (DEV, BCT, and COT layers) of the processing block C2 are configured in a similar manner in a plan view. The explanation will be made, taking the second block (BCT layer) B2 for example, with reference to FIG. 4. The second block (BCT layer) B2 includes an antireflective film forming unit 21 for forming an antireflective film, underlying the resist film, as a coating film, shelf units U1 to U5 each composed of heating (thermal) modules, and a transport arm G2 disposed between the antireflective film forming unit 21 and the shelf units U1 to U5 to transfer wafers W between modules included in those units. The modules are the components of the coating and developing apparatus 1 each providing a place in which a wafer W is placed.

The antireflective film forming unit 21 includes four antireflective film forming modules BCT1 to BCT4. The antireflective film forming modules BCT1 to BCT4 each include a spin chuck 22 and a chemical liquid supply nozzle (not shown). The spin chuck 22 holds the central portion of the back surface of the wafer and rotates the wafer around a vertical axis. The chemical liquid supply nozzle supplies a chemical liquid to the wafer W placed at the spin chuck 22.

The shelf units U1 to U5 are arranged along a transport region R1, which is a horizontal straight transport path through which the transport arm G2 moves. Each shelf unit is formed by vertically stacking two heating modules 23. Each heating module includes a hot plate so that a wafer placed on the hot plate is subjected to thermal processing.

The transport arm G2 includes a guide 31. The guide 31 is horizontally extended from the carrier block C1 toward an interface block C4 to that a frame 32 moves along the guide 31. The frame 32 has an elevating platform 33 that ascends and descends along a vertical axis. A base 34, which pivots around the vertical axis, is disposed on the elevating platform 33. The base 34 includes an upper fork 35 and a lower fork 36 to enclose the lateral circumference of the wafer W. The upper fork 35 and the lower fork 36 independently advance and retract above the base 34 to access a module. The upper fork 35 and the lower fork 36 are respectively equipped with back surface supports 38, 39, which support the back surface of the wafer W.

The third block (COT layer) B3 includes resist film forming modules COT1 to COT4, each having a mechanical configuration corresponding to the antireflective film forming modules BCT1 to BCT4. The third block (COT layer) B3 has the same configuration as the second block (BCT layer) B2 except that supplied to the wafer W in the resist film forming modules COT1 to COT4 is a resist solution, instead of a chemical liquid for an antireflective film formation.

Two development processing units, each having a mechanical configuration corresponding to the antireflective film forming unit 21, are stacked in the first block (DEV layer) B1. Each development processing unit includes developing modules DEV. The developing module DEV, the antireflective film forming modules BCT, and the resist film forming modules COT are generically referred to as liquid processing modules.

The DEV layer B1 includes the shelf units U1 to U5, as is the case with the BCT layer B2. The heating modules forming the shelf units U1 to U5 include a plurality of heating modules (PEB) for performing a heating process before development processing and a plurality of heating modules (POST) for performing a heating process to the wafer W after development processing. A transport arm G1 of the DEV layer B1 transports the wafer W to each developing module DEV and to each heating module. In other words, one transport arm G1 is used commonly with respect to the two stacked development processing units.

The operation of a transport arm G, which is a substrate transport mechanism for individual layers, will now be described in detail. It is now assumed that one of the upper fork 35 and the lower fork 36 holds no wafer W while the other fork holds a wafer W, and that the base 34 for the transport arm G is positioned before a certain module. In this state, the one of the upper fork 35 or the lower fork 36 advances to the module and removes a wafer W placed in the module. The wafer W held by the other fork is then transferred to the emptied module. Subsequently, the base 34 for the transport arm G moves to transfer the wafer W to a downstream module. In the present embodiment, the transport arm G configured as described above is used to charge a sensor wafer 8 as described later.

The processing block C2 has a shelf unit U6 as shown in FIGS. 1 and 3. A wafer W received from the carrier block C1 is transported to a transfer module BF1 in the shelf unit U6. The transport arm G2 of the BCT layer B2 receives the wafer W from the transfer module BF1 and transports the wafer W to one of the antireflective film forming modules BCT1 to BCT4. After an antireflective film is formed on the wafer W, the transport arm G2 of the BCT layer B2 transports the wafer W to a heating module 23.

Subsequently, the transport arm G2 transports the wafer W to a transfer module BF2 in the shelf unit U6. A transfer arm D1 then transports the wafer W to a transfer module BF3 corresponding to the third block (COT layer) B3. A transport arm G3 in the third block (COT layer) B3 receives the wafer W from the transfer module BF3 and transports the wafer W to one of the resist coating modules COT1 to COT4. After completion of resist film formation, the transport arm G3 in the third block (COT layer) B3 transports the wafer W to the heating module 23.

Subsequently, after thermally processed in the heating module, the wafer W is transported to a transfer module BF4 in the shelf unit U6. Meanwhile, disposed in an upper region of the DEV layer B1 is a shuttle 16 for directly transporting a wafer W from a transfer module TRS14 in the shelf unit U6 to a transfer module TRS15 in a shelf unit U7. The wafer W on which a resist film is formed is then transferred by the transfer arm D1 from the transfer module BF4 to the transfer module TRS14. The transfer module TRS14 transfers the wafer W to the shuttle 16.

The shuttle 16 transports the wafer W to the transfer module TRS15 in the shelf unit U7. The wafer W is then received by an interface arm 18 in the interface block C4, and transported to an interface block C3. Transfer modules whose symbols are prefixed by "CPL" in FIG. 3 also function as a cooling module for temperature control. Transfer modules whose symbols are prefixed by "BF" also function as a buffer module in which a plurality of wafers W can be placed.

Subsequently, the wafer W is transported to an exposure apparatus C4 by the interface arm 18 and subjected to an exposure process. Next, an interface arm 17 transports the wafer W to a transfer module TRS11 or a transfer module TRS12, which are included in the shelf unit U7. The wafer W is then transported by the transport arm G1 of the first block (DEV layer) B1 to the heating modules (PEB) included in the shelf units U1 to U5 and thermally processed.

Next, the wafer W is transported by the transport arm G1 to a transfer module CPL1 or to a transfer module CPL2, then transported to the developing module DEV and subjected to a development process. Subsequently, the wafer W is transported to the heating module (POST) and thermally processed. The thermally-processed wafer W is transported by the transport arm G1 to a transfer module BF7 in the shelf unit U6. The wafer W is then returned to its original position in the carrier C by the transfer arm 12.

The carrier block C1 includes a standby module 4, which is disposed at a position that the transfer arm 12 can access. The standby module 4 stores sensor wafers 8A to 8C, which are transported to a module to conduct a predetermined inspection, and a power feeding wafer 6, which is a charging substrate. The power feeding wafer 6 is a tool for charging the sensor wafers 8A to 8C outside the standby module 4. The power feeding wafer 6 is charged by the standby module 4. The sensor wafers 8A to 8C may be referred to as the sensor wafers 8 if they need not be distinguished from each other. The sensor wafers 8 and power feeding wafer 6 may be placed in the dedicated carrier (cassette) C, which may be placed on the mounting stage 11 of the carrier block C1 to be used only for inspection purpose. The standby module 4 may be disposed in the shelf unit U6 or disposed anywhere as far as the sensor wafers 8 and power feeding wafer 6 can be transferred to each transport arm G.

Figure 5:
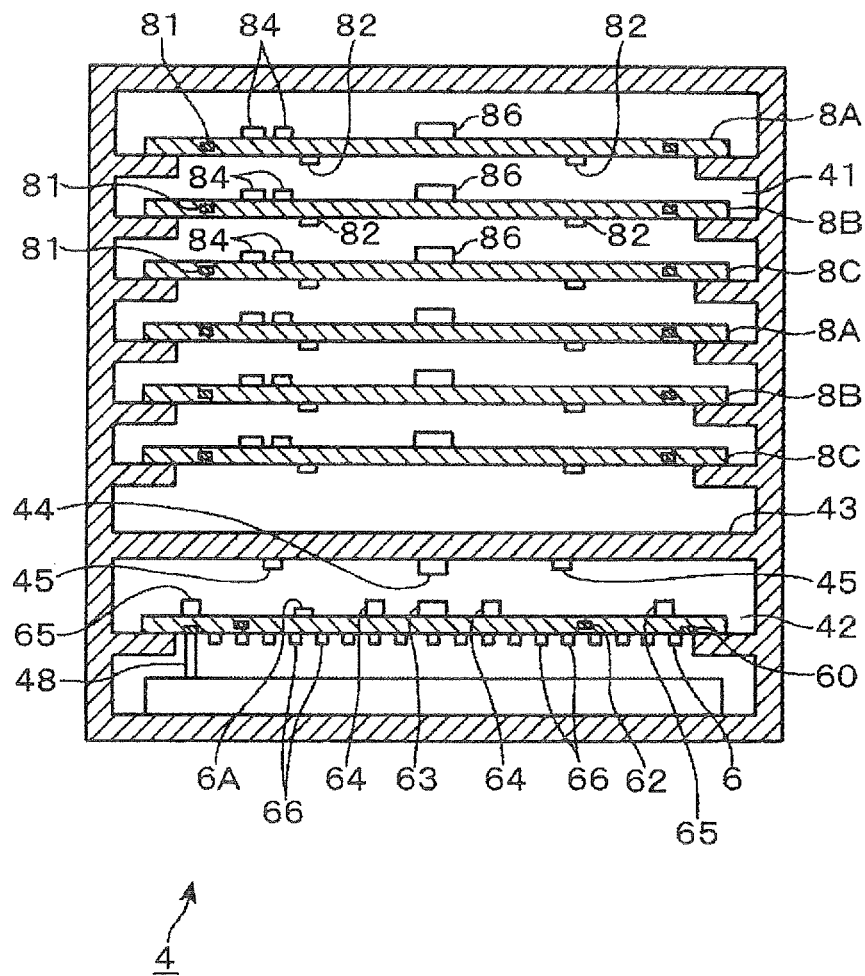
FIG. 5 is a vertically-sectioned side view illustrating a standby module included in the coating and developing apparatus.

FIG. 5 is a vertically-sectioned side view of the standby module 4. The standby module 4 is configured in a form of a shelf, so that the standby module 4 can store a plurality of wafers while supporting the periphery of each wafer, and with the wafers being arrayed in the vertical direction. For example, the upper portion of the standby module 4 is configured as a storage space 41 for the sensor wafers 8A to 8C, whereas the lower portion of the standby module 4 is configured as a storage space 42 for the power feeding wafer 6. The storage spaces 41, 42 are separated from each other by a partition wall 43.

Figure 6:
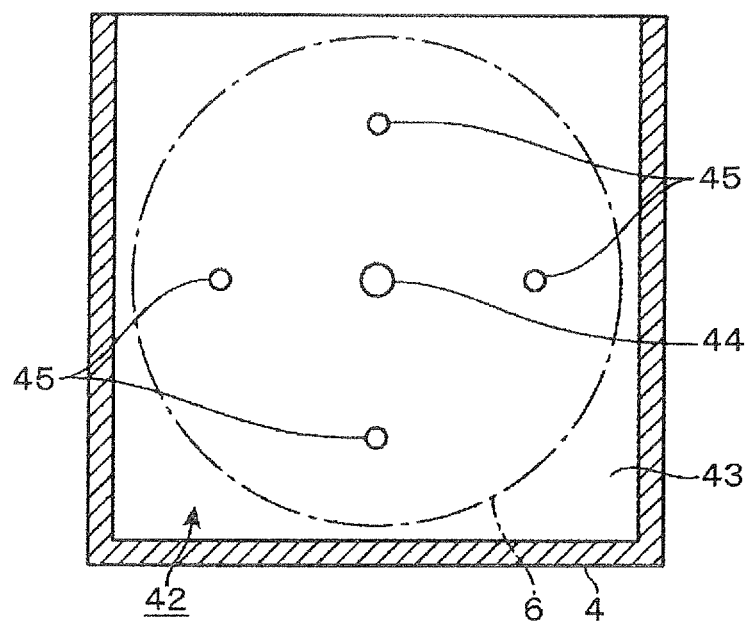
FIG. 6 is a plan view illustrating the ceiling of a power feeding wafer storage section (a lower surface a partition wall) in the standby module.

FIG. 6 shows the lower surface of the partition wall 43. The lower surface is provided with a light receiver 44, which is a photosensor. The light receiver 44 is positioned above the center of the power feeding wafer 6 stored in the storage space 42 to face a light emitter 63 (described later) of the power feeding wafer 6. The light receiver 44 and the light emitter 63 are used for the control of continuing or stopping of contact power feed from the standby module 4 to the power feeding wafer 6. The lower surface of the partition wall 43 is also provided with a plurality of magnetic sensors 45 that surround the light receiver 44. The magnetic sensors 45 are provided at positions corresponding to a magnet 62 on the power feeding wafer 6 to position above the magnet 62. The magnetic sensors 45 detect the position of the magnet 62, i.e., the position of the power feeding wafer 6 to trigger the start of power feeding from the standby module 4 to the power feeding wafer 6.

A lower portion of the storage space 42 is provided with a flat circular power feeder 46. The surface of the power feeder 46 is provided with a power feeding pin 48 extending upward. The power feeding pin 48 supplies electric power to the power feeding wafer 6.

Figure 7:
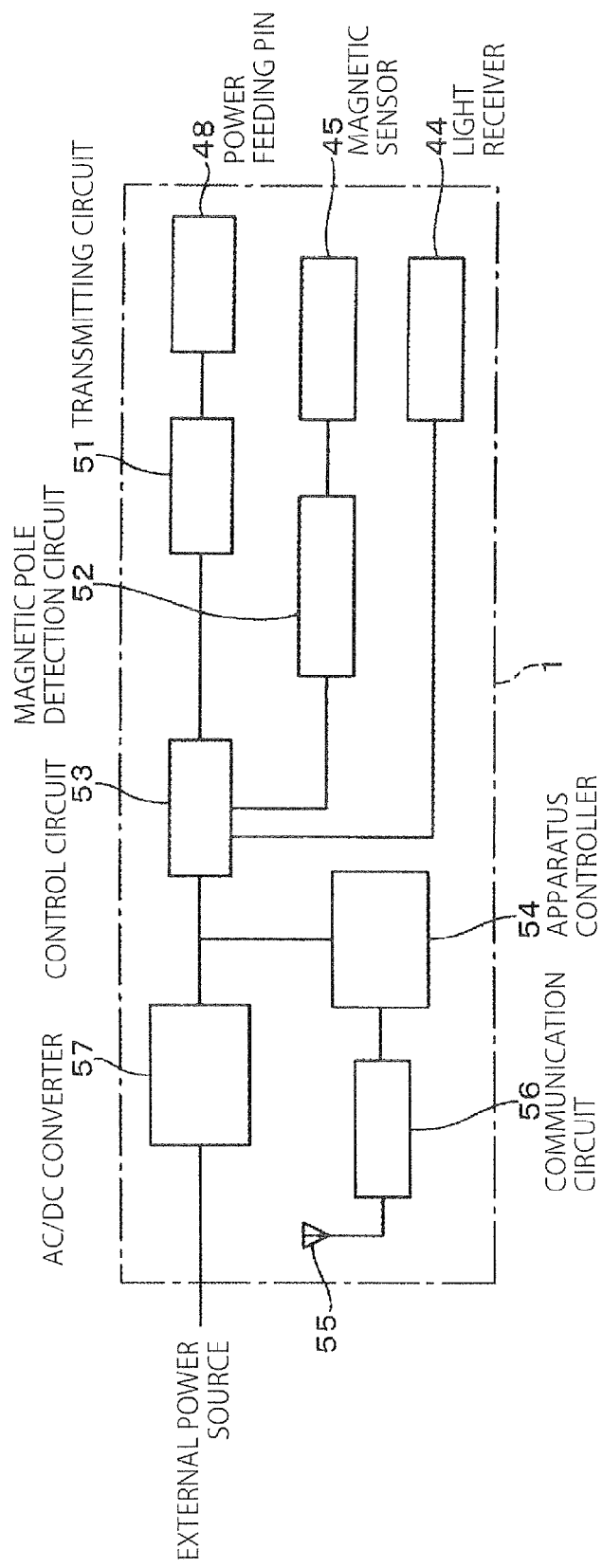
FIG. 7 is a schematic circuit diagram of a portion related to a data acquisition method of the coating and developing apparatus.

FIG. 7 is a schematic circuit diagram of a portion relating to the data acquisition method in the developing apparatus 1, which includes the standby module 4. The power feeding pin 48 is connected to a power transmission circuit 51 that transmits electric power to the power feeding pin 48. The power transmission circuit 51 is connected to an apparatus controller 54 through a control circuit 53. The light receiver 44 is connected to the control circuit 53. The magnetic sensors 45 are connected to the control circuit through a magnetic pole detection circuit 52. Upon detection of the magnetic force of the magnet 62, the magnetic sensors 45 turn ON and output a signal, corresponding to the detected magnetic force, to the magnetic pole detection circuit 52. The magnetic pole detection circuit 52 outputs a detection signal, corresponding to the signal output from the magnetic sensor 45, to the apparatus controller 54. Hence, the apparatus controller 54 detects the intensity of the magnetic force.

The coating and developing apparatus 1 includes an antenna 55. The antenna 55 wirelessly receives an inspection data signal transmitted from the sensor wafers 8. The signal received by the antenna 55 is output to the apparatus controller 54 through a communication circuit 56 that controls the communication via the antenna 55. An AC/DC converter 57 is connected upstream of the control circuit 53 and of the apparatus controller 54 so that an alternating current supplied from an AC power source external to the coating and developing apparatus 1 is converted by the AC/DC converter 57 to a direct current and supplied to various circuits. The control circuit 53 controls the electric power to be supplied to various downstream circuits. The antenna 55, the communication circuit 56, and the apparatus controller 54 constitute a receiving section that receives data on the processing modules.

The apparatus controller 54 is formed, for instance, by a computer and equipped with a program storage section (not shown). The program storage section stores, for example, a software program that incorporates commands for performing the above-described and later-described transport operations to execute a transport cycle. The apparatus controller 54 reads the program and then transmits control signals to various sections or parts of the coating and developing apparatus 1. As a result, the operations of the various sections of the coating and developing apparatus 1 are controlled such that operations of each module and transfer of each wafer between the modules are controlled, for example. The program is stored in the program storage section with the program being stored in a hard disk drive, compact disc, magneto-optical disk, memory card, or other storage medium.

Figure 8:
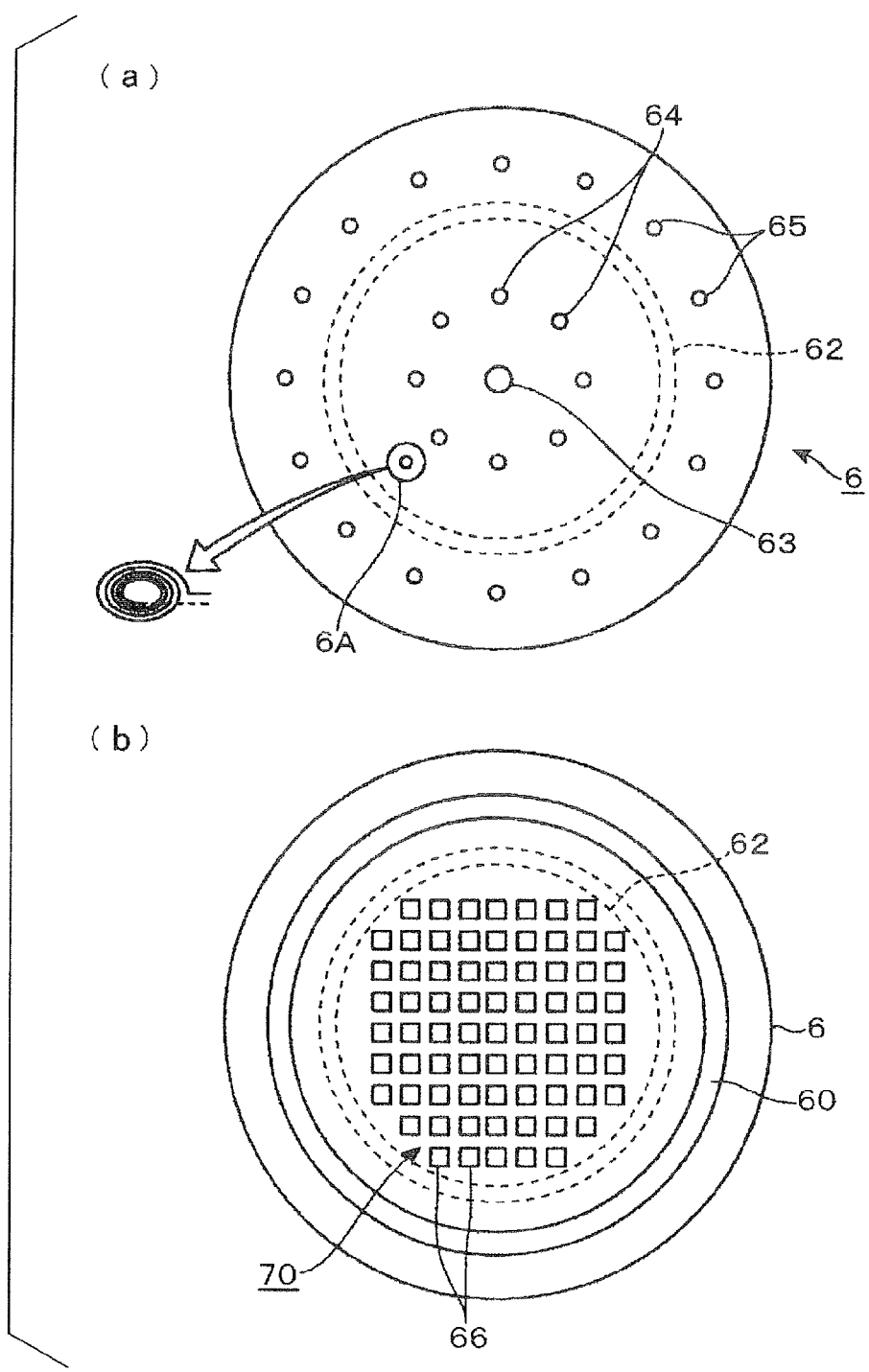
FIG. 8 shows a top view (a) and a bottom view (b) of the power feeding wafer.

The power feeding wafer 6 will now be described with reference to FIG. 8, which illustrates the front and back surfaces of the power feeding wafer 6. The aforementioned magnet 62 is embedded in the power feeding wafer 6 in the form, for instance, of a ring.

The front surface of the power feeding wafer 6 will be described below. The light emitter 63 is disposed at the center of the front surface. A plurality of light receivers 64 are disposed around the light emitter 63. The plurality of light receivers 64 are circumferentially disposed such that the light receivers 64 can receive a light emitted from a light emitter 83 regardless of the orientation of the power feeding wafer 6. The light receivers 64 and the light emitter 83 are used for the control of continuing or stopping of non-contact power feed from the power feeding wafer 6 to the sensor wafers 8.

A plurality of magnetic sensors 65 are disposed, for instance, radially outside the light receivers 64. These magnetic sensors 65 are circumferentially disposed, for instance, on the power feeding wafer 6. The magnetic sensors 65 provided to correspond to a magnet 81 disposed on the sensor wafers 8. The magnetic sensors 65 detect the position of the magnet 81, namely, the positions of the sensor wafers 8A to 8C, and trigger the start of non-contact power feed (wireless power feed) from the power feeding wafer 6 to the sensor wafers 8. Further, the front surface of the power feeding wafer 6 is provided with a power feeding coil 6A. As indicated by an arrowed lead line in FIG. 8(a), the power feeding coil 6A is a planar coil that is formed by winding a conductive wire in a planar manner.

The back surface of the power feeding wafer 6 will be described below. The back surface is provided with many electric double-layer capacitors 66 that form an electricity storage section. The electric double-layer capacitors 66 store electric power supplied from the standby module 4. The electric double-layer capacitors 66 can perform charging/discharging operations at a high speed and rapidly charge the sensor wafers 8. Therefore, the time required for acquiring the data on the modules can be reduced. The back surface of the power feeding wafer 6 is also provided with a ring-shaped electrode 60. The electrode 60 comes into contact with the power feeding pin 48 of the standby module 4 so that the electric power transmitted from the power feeding pin 48 is supplied to the electric double-layer capacitors 66 through the electrode 60.

Figure 9:
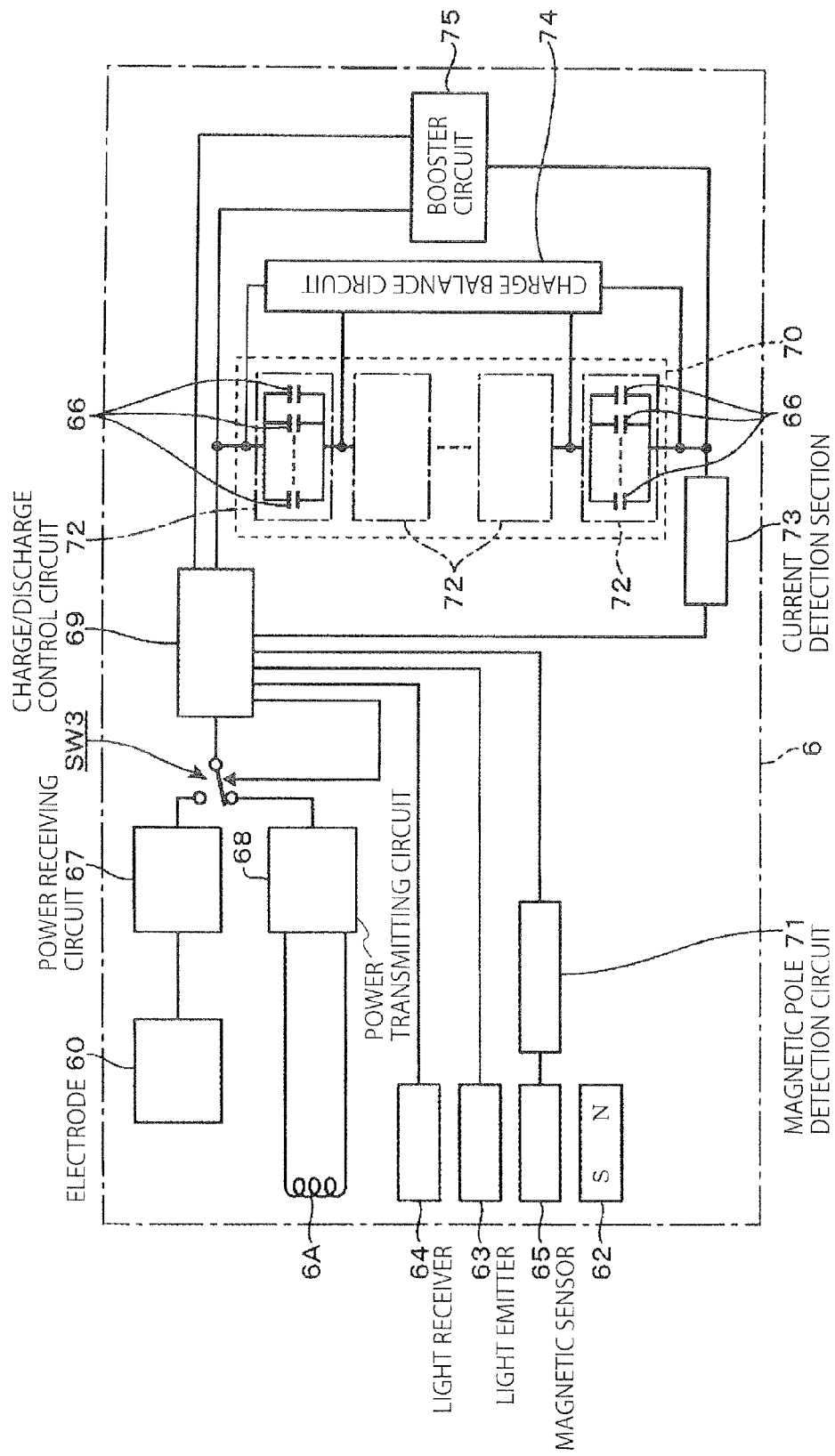
FIG. 9 is a schematic circuit diagram of the power feeding wafer.

FIG. 9 is a schematic circuit diagram of the power feeding wafer 6. A power receiving circuit 67 and a power transmitting circuit 68 are connected to power feeding coil 6A and to the electrode 60. A switch SW3 is provided so as to connect either the power receiving circuit 67 or the power transmitting circuit 68 to a later-described charge/discharge control circuit 69. The light emitter 63 and the light receivers 64 are connected to the charge/discharge control circuit 69. The magnetic sensors 65 are connected to the charge/discharge control circuit 69 through a magnetic pole detection circuit 71. Based on the outputs of the light receivers 64 and of the magnetic pole detection circuit 71, the charge/discharge control circuit 69 controls the switching operations of the switch SW3.

A plurality of electric double-layer capacitors 66 which are connected in parallel form one parallel unit 72. A plurality of parallel units 72 which are connected in series form a power supply section 70. When the power supply section 70 (second power supply section) is to be charged, the switch SW3 is switched to connect the electrode 60 to the power supply section 70 through the power receiving circuit 67. When the sensor wafers 8 are to be charged, the switch SW3 is switched to connect the power feeding coil 6A to the power supply section 70 through the power transmitting circuit 68. The power supply section 70 and a current detection section 73 are series-connected to the charge/discharge control circuit 69. Based on an output generated from the current detection section 73, the charge/discharge control circuit 69 judges whether the power supply section 70 is fully charged, and controls the light emitting operation of the light emitter 63 accordingly.

The power feeding wafer 6 includes a charge balance circuit 74 and a booster circuit 75. The charge balance circuit 74 suppresses any charge imbalance in each electric double-layer capacitor 66. The magnetic sensors 65 are connected to the charge/discharge control circuit 69 through the magnetic pole detection circuit 71. Upon detection of the magnetic force of the magnet 81 on the sensor wafers 8, the magnetic sensors 65 turn ON and output a signal, corresponding to the detected magnetic force, to the magnetic pole detection circuit 71. The magnetic pole detection circuit 71 outputs a detection signal, corresponding to the signal output from the magnetic sensors 65, to the apparatus controller 54 to let the apparatus controller 54 detect the intensity of the magnetic force.

Figure 10:
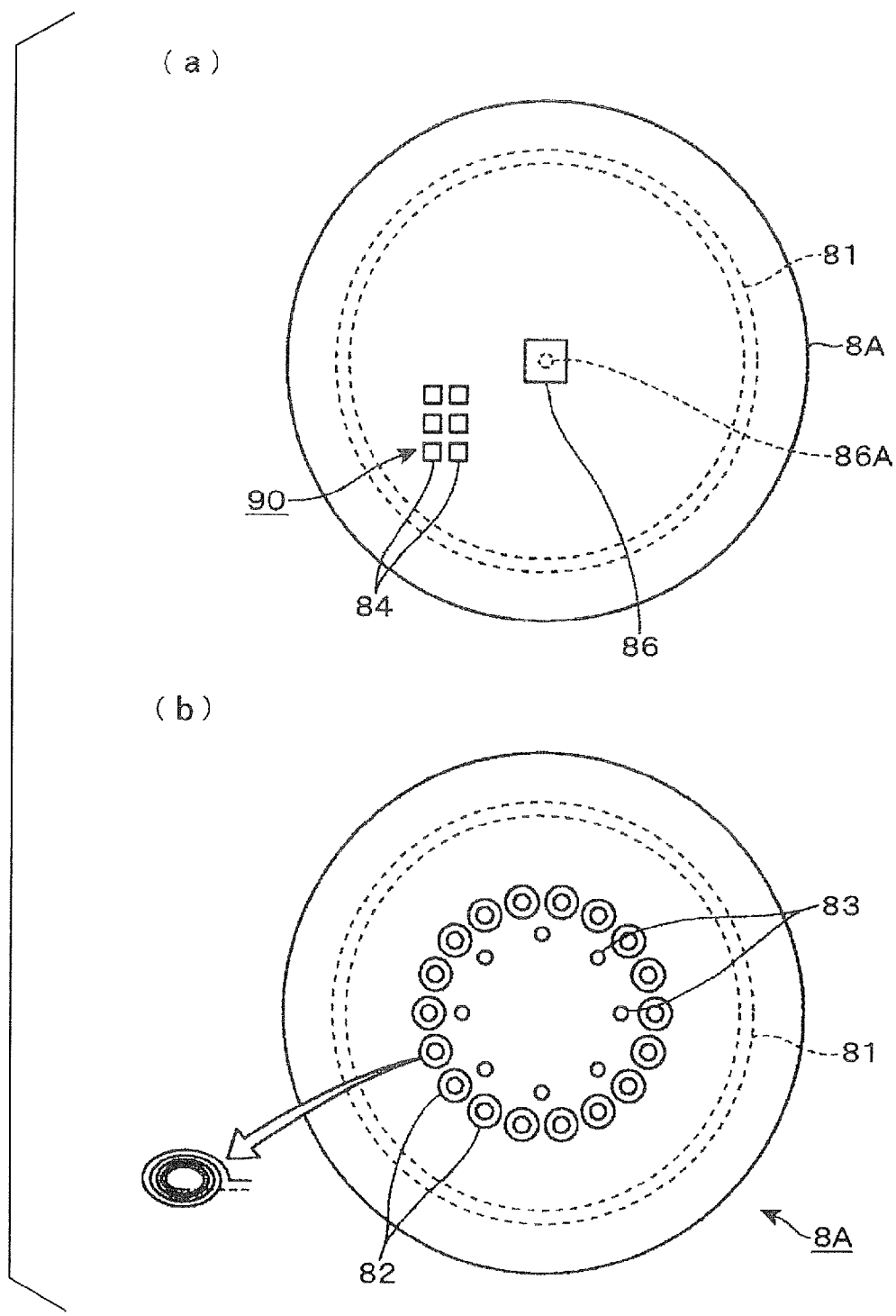
FIG. 10 shows a top view (a) and a bottom view (b) of the sensor wafer.

The sensor wafers 8 will now be described. The sensor wafers 8A to 8C have the same configuration except that they include different types of sensors. The sensor wafer 8A will be described below as a representative example. The sensor wafer 8A includes, for example, an acceleration sensor, and locates the rotation center of the spin chuck 22 as described in "Background Art". FIG. 10 illustrates the front (a) and back (b) surfaces of the sensor wafer 8A. For example, the ring-shaped magnet 81, which corresponds to the magnetic sensors 65 on the power feeding wafer 6, is embedded in the sensor wafer 8A.

The front surface of the sensor wafer 8A will now be described. A circuit unit 86 including an acceleration sensor 86A is mounted on the front surface. The acceleration sensor 86A is positioned at the center of the sensor wafer 8A. When the inspection wafer 8A rotates on the spin chuck 22 to apply acceleration to the acceleration sensor 86A, the sensor wafer 8A outputs a signal, corresponding to the acceleration, to the apparatus controller 54. The apparatus controller 54 computes the center of rotation of the spin chuck 22 based on the signal.

The front surface of the sensor wafer 8A is also provided with electric double-layer capacitors 84. The electric double-layer capacitors 84 serve as an electricity storage section that stores the electric power supplied from the power feeding wafer 6. Like the electric double-layer capacitors 66, the electric double-layer capacitors 84 can perform charging/discharging operations at a high speed and are rapidly charged by the power feeding wafer 6. Therefore, the time required for acquiring the data on the modules can be reduced.

The back surface of the sensor wafer 8A will now be described. A plurality of light emitters 83, which respectively face and make a pair with the light receivers 64 of the power feeding wafer 6, are circumferentially disposed on the back surface. The light emitters 83 are not depicted in FIG. 5. A plurality of power receiving coils 82 are circumferentially disposed on the sensor wafer 8A. As indicated by an arrowed lead line in FIG. 10(b), the power receiving coils 82 are planar coils. For example, a magnetic sheet (not shown) and a metal sheet (not shown) are stacked between the power feeding coil 6A and the front surface of the power feeding wafer 6 and between the power receiving coils 82 and the sensor wafer 8A so as to avoid unnecessary radiation that may occur due to a magnetic field or electric field when electric power is wirelessly fed as described later.

Figure 11:
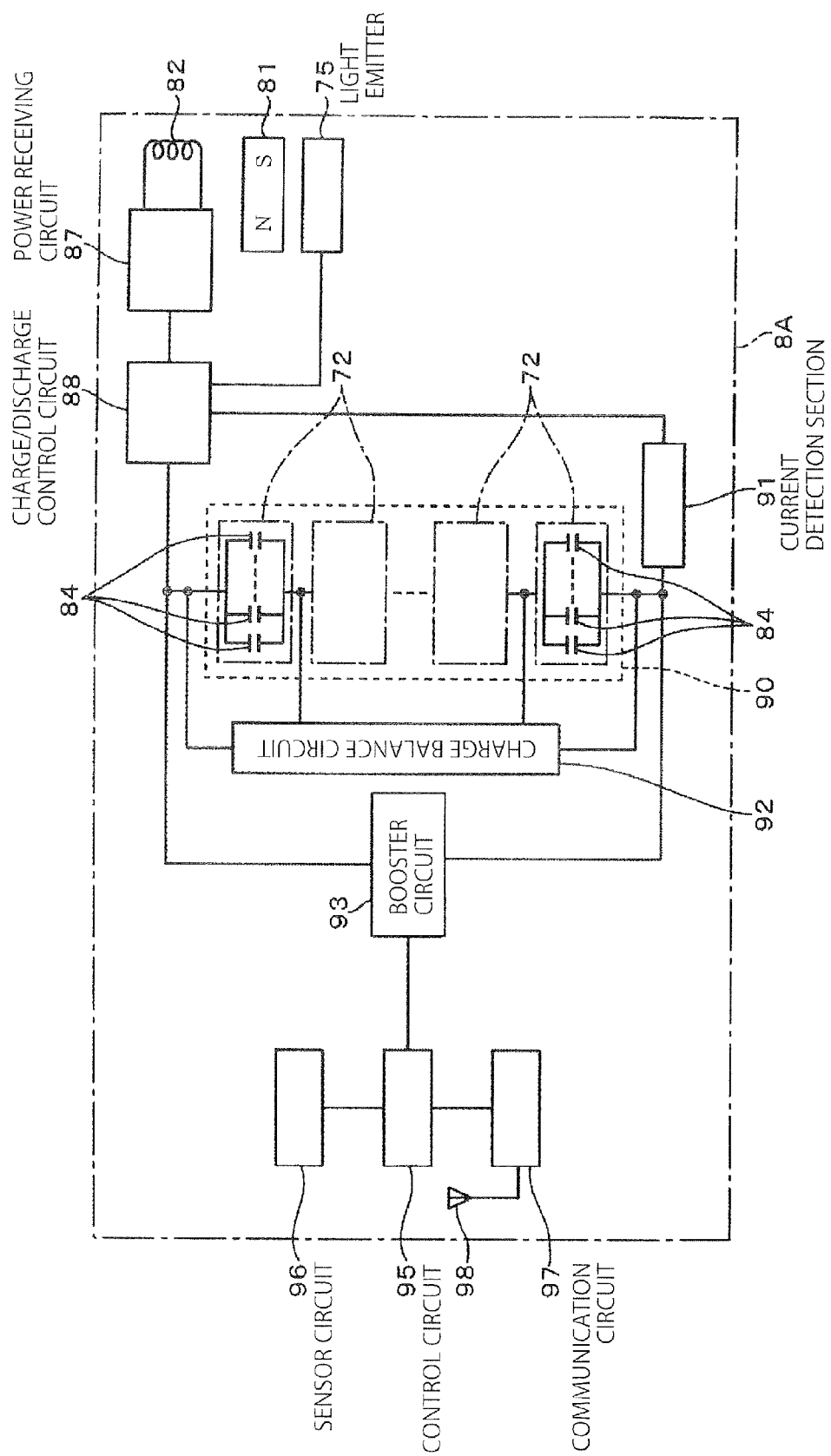
FIG. 11 is a schematic circuit diagram of the sensor wafer.

FIG. 11 is a schematic circuit diagram of the sensor wafer 8A. Referring also to FIG. 11, the power receiving coils 82 are connected to a charge/discharge control circuit 88 through a power receiving circuit 87, and the light emitters 83 are connected to the charge/discharge control circuit 88. Like the power feeding wafer 6, the electric double-layer capacitors 84 are interconnected to form a power supply section 90. However, the capacity of the power supply section 90 (first power supply section) is set so as to store electric power necessary for acquiring data on one module, and smaller than the capacity of the power supply section 70 for the power feeding wafer 6. Like the power feeding wafer 6, a charge balance circuit 92 is connected to the power supply section 90 to suppress any charge imbalance in each electric double-layer capacitor 84.

Like the power feeding wafer 6, a current detection section 91 is mounted on the sensor wafer 8A and positioned between the charge/discharge control circuit 88 and the power supply section 90. Based on an output generated from the current detection section 91, the charge/discharge control circuit 88 judges whether the power supply section 90 is fully charged, and performs ON/OFF control of the light emitter 83.

A booster circuit 93 is disposed downstream of the power supply section 90 so that an output voltage higher than an input voltage from the power supply section 90 is output to a downstream control circuit 95 through the booster circuit 93. A sensor circuit 96 which constitutes the acceleration sensor 86A, and a communication circuit 97 are connected to the control circuit 95. The control circuit 95 controls the output from the sensor circuit 96 to the communication circuit 97. Data acquired by the sensor circuit 96 is input into the communication circuit 97 through the control circuit 95 and transmitted from an antenna 98 to the apparatus controller 54. The control circuit 95, the communication circuit 97, and the antenna 98 constitute a wireless transmission section that receives the electric power supplied from the power supply section 90 and transmits data.

The sensor wafer 8B has a temperature sensor instead of the acceleration sensor 86A. The temperature sensor acquires data, for example, on the heating temperature of a wafer in the heating module in each layer. The data on the heating temperature is obtained, for instance, by recording all the changes of wafer temperature during a heating process in the heating module with respect to process time. The sensor wafer 8C has a humidity sensor and a wind speed sensor, which measure, for example, the humidity and wind speed in each module, instead of the acceleration sensor 86A. The humidity sensor and wind speed sensor respectively measure the humidity in a process of a module and measure the direction of air flowing in a process as well as the speed of wind in the process. The sensor wafers 8 have the same configuration except that they differ in the employed sensor and in the data to be acquired by the sensor.

The sensor to be mounted on the sensor wafers 8 and the type of module data to be acquired are not limited to those mentioned above. For example, the sensor wafers may include a tilt sensor and is configured to acquire the tilt data on an installed module when transported to the module. As described above, the sensor wafers acquire data for adjusting process parameters and data for verifying the settings for performing an optimum process. In accordance with the purpose of measurements, a user is supposed to set and select the sensor wafers to be used.

Figure 12:
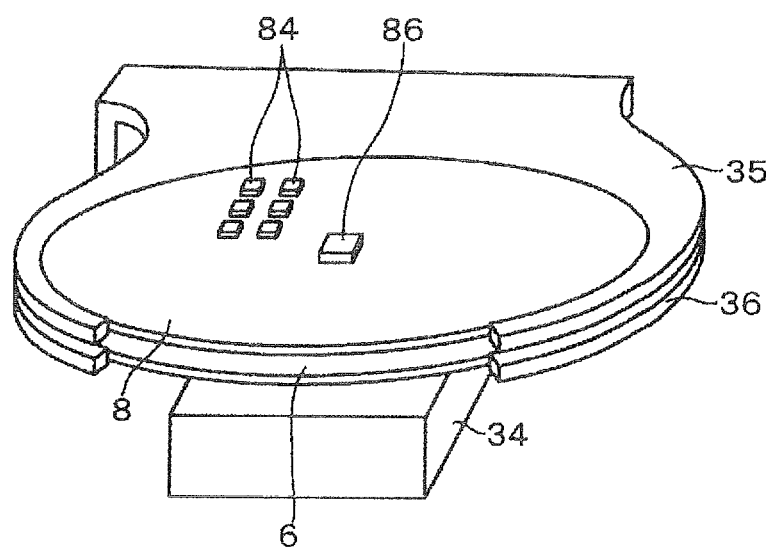
FIG. 12 is a perspective view of the transport arm when the sensor wafer is being charged.
Figure 13:
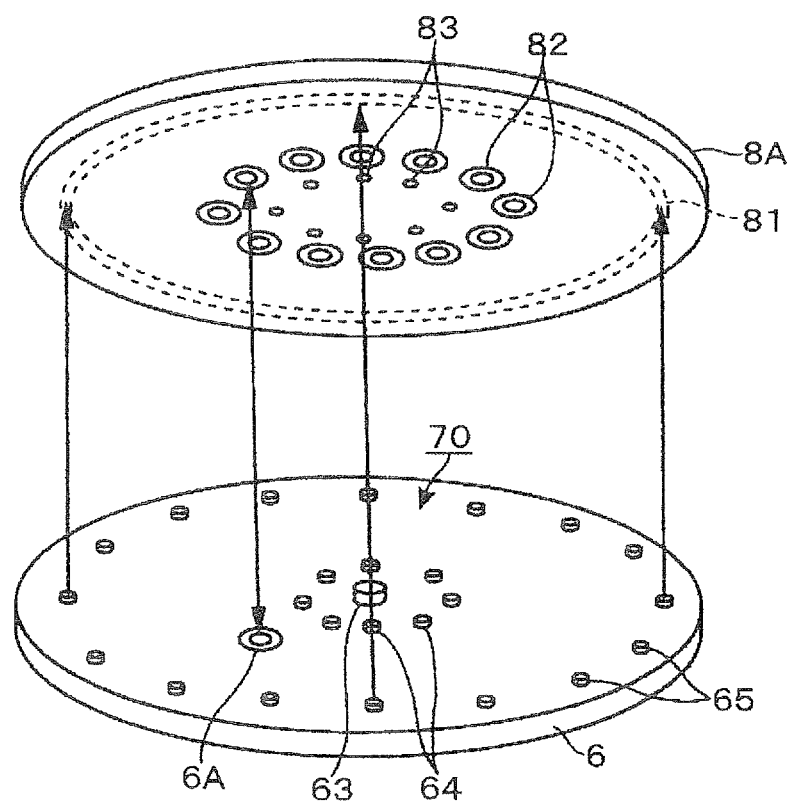
FIG. 13 is a perspective view illustrating the positional relationship between the sensor wafer and the power feeding wafer.
Figure 14:
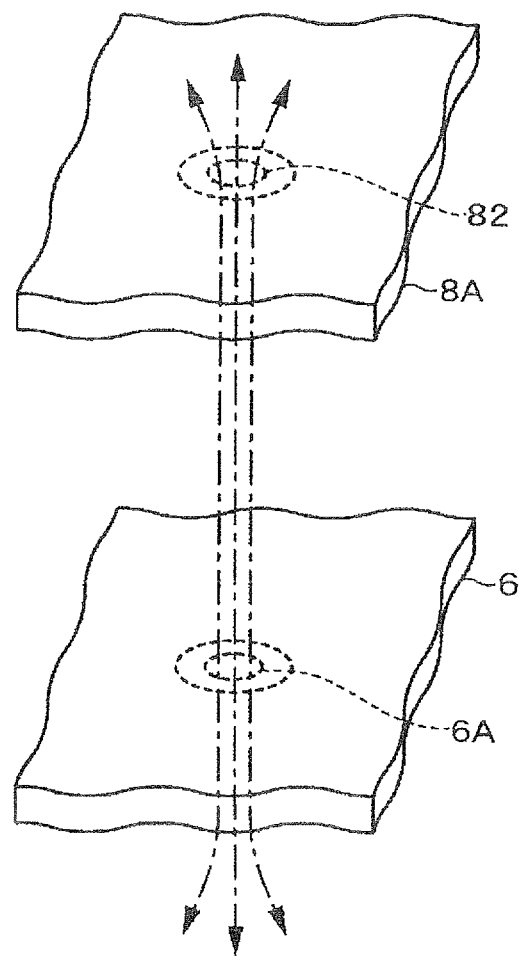
FIG. 14 is a diagram illustrating how power is fed by magnetic field induction.

As shown in FIG. 12, the sensor wafer 8A and the power feeding wafer 6 are retained by the upper fork 35 and the lower fork 36, respectively. When the base 34 moves in the transport region R1, the upper fork 35 and the lower fork 36 are in their retracted position shown in FIG. 12, so that the sensor wafer 8A overlaps the power feeding wafer 6. In this instance, as shown in FIG. 13, the magnet 81 on the sensor wafer 8A is positioned above the magnetic sensors 65 on the power feeding wafer 6, and the power receiving coils 82, which are secondary coils, are positioned above the power feeding coil 6A, which is a primary coil.

When the aforementioned positional relationship is established, the magnetic force detected by the charge/discharge control circuit 69 through the magnetic sensors 65 exceeds a threshold value so that the charge/discharge control circuit 69 is disconnected from the power receiving circuit 67 and connected to the power transmitting circuit 68. An electric current then flows from the power supply section 70 to the power feeding coil 6A so that a magnetic flux is formed around the power feeding coil 6A. The magnetic flux is indicated by arrowed chain lines in FIG. 13. An electromotive force is induced in the power receiving coils 82 on the sensor wafer 8A due to electromagnetic induction. An electric current then flows to the power supply section 90 of the sensor wafer 8A to charge the power supply section 90.

Figure 15:
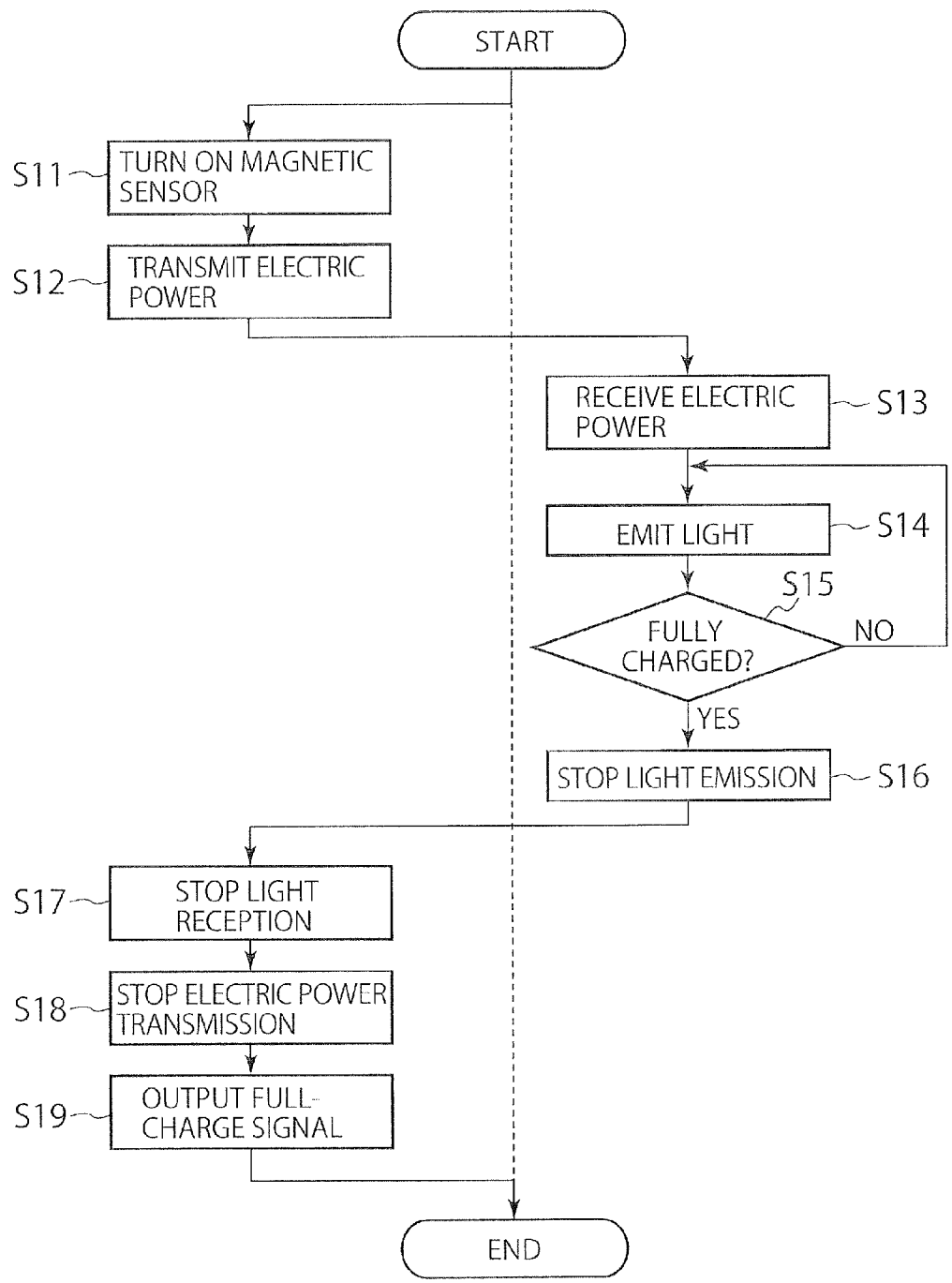
FIG. 15 is a flowchart illustrating a process of charging the power feeding wafer.
Figure 16:
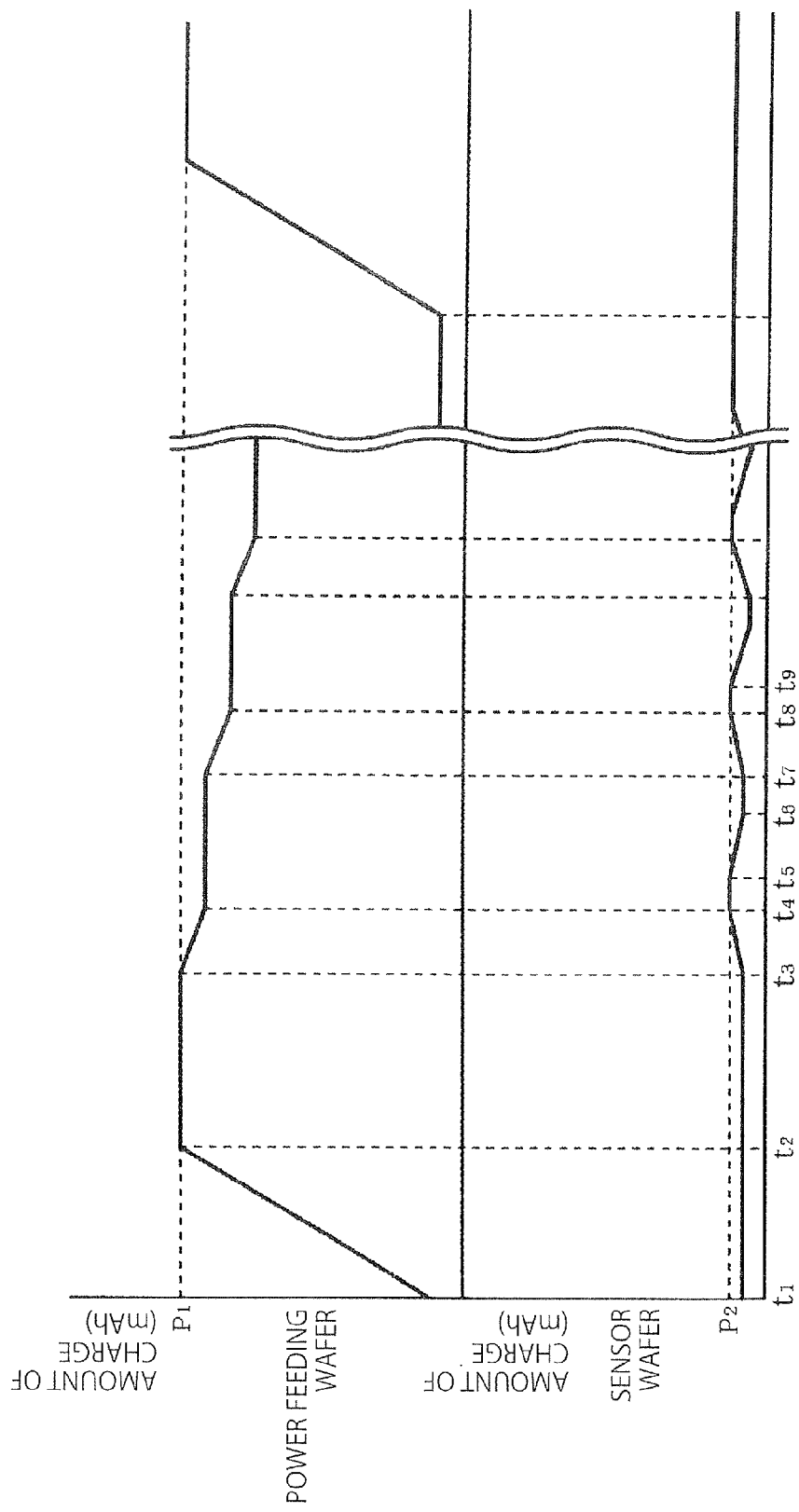
FIG. 16 is a timing diagram illustrating changes in the amount of charge stored in the power feeding wafer and in the sensor wafer.

Referring now to FIG. 15, a flow in which the standby module 4 charges the power feeding wafer 6 when the coating and developing apparatus 1 is turned on will be described. The flowchart is divided into a left half and a right half by a dotted line. The left half depicts the operation of the standby module 4, whereas the right half depicts the operation of the power feeding wafer 6. FIG. 16 is a graph illustrating changes in the amount of charge stored in the power feeding wafer 6 and in the sensor wafer 8A. The horizontal axis of the graph represents time, whereas the vertical axis of the graph represents the amount of charge (mAh). Points P1 and P2, which are indicated along the vertical axis, represent a full charge level of the sensor wafer 8A and a full charge level of the power feeding wafer 6, respectively. The description below will be given with reference to FIG. 16 as well.

Before the coating and developing apparatus 1 is turned on, the sensor wafers 8 and the power feeding wafer 6 are on standby in the standby module 4 as shown in FIG. 5 and the electrode 60 of the power feeding wafer 6 is connected to the power supply section 70 through the power receiving circuit 67. Further, the power feeding pin 48 of the standby module 4 is in contact with the electrode 60. When the coating and developing apparatus 1 turns on, the magnetic sensors 45 of the standby module 4 detect the magnetic force of the magnet 62 in the power feeding wafer 6 and turn ON (step S11). Electric power is then transmitted to the electrode 60 (step S12, at time t1 in FIG. 16) to charge the power supply section 70 of the power feeding wafer 6. Consequently, light is emitted from the light emitter 63 (step S14). The light receivers 64 of the standby module 4 then receive the light emitted from the light emitter 63 so that the electric power is continuously transmitted to the power feeding pin 48.

The charge/discharge control circuit 69 of the power feeding wafer 6 judges whether the power supply section 70 is fully charged (step S15). If it is judged that the power supply section 70 is not fully charged, the light emission from the light emitter 63 continues to continuously charge the power supply section 70. If, on the other hand, it is judged that the power supply section 70 is fully charged (time t2 in FIG. 16), the light emitter 63 stops its light emission (step S16) and thus the light receivers 64 of the standby module 4 no longer receives light (step S17), the electric power transmission to the power feeding pin 48 stops (step S18), and a full charge signal is transmitted to the apparatus controller 54 to indicate that the power feeding wafer 6 is fully charged (step S19).

Figure 17:
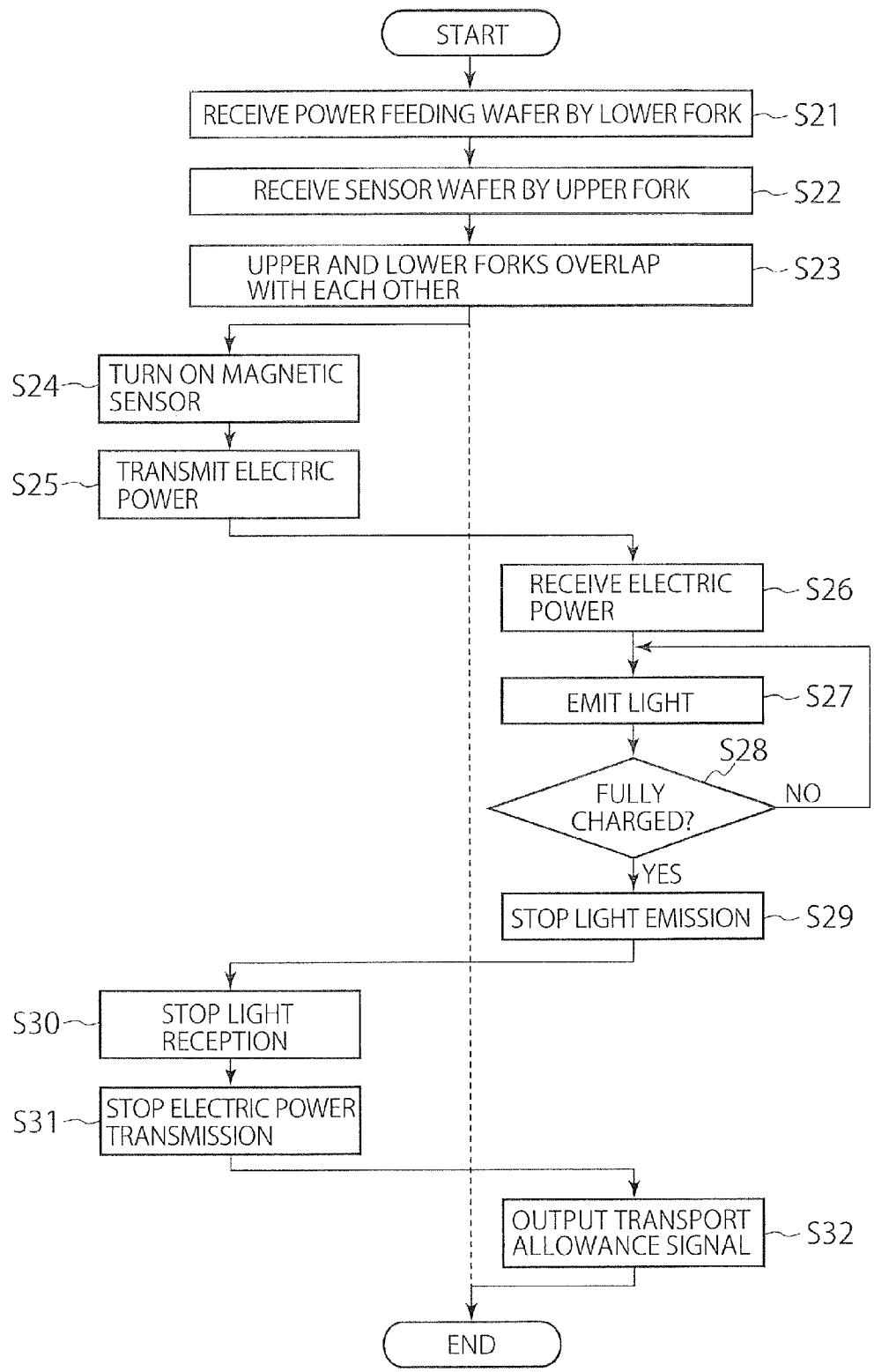
FIG. 17 is a flowchart illustrating a process of charging the sensor wafer.
Figure 19:
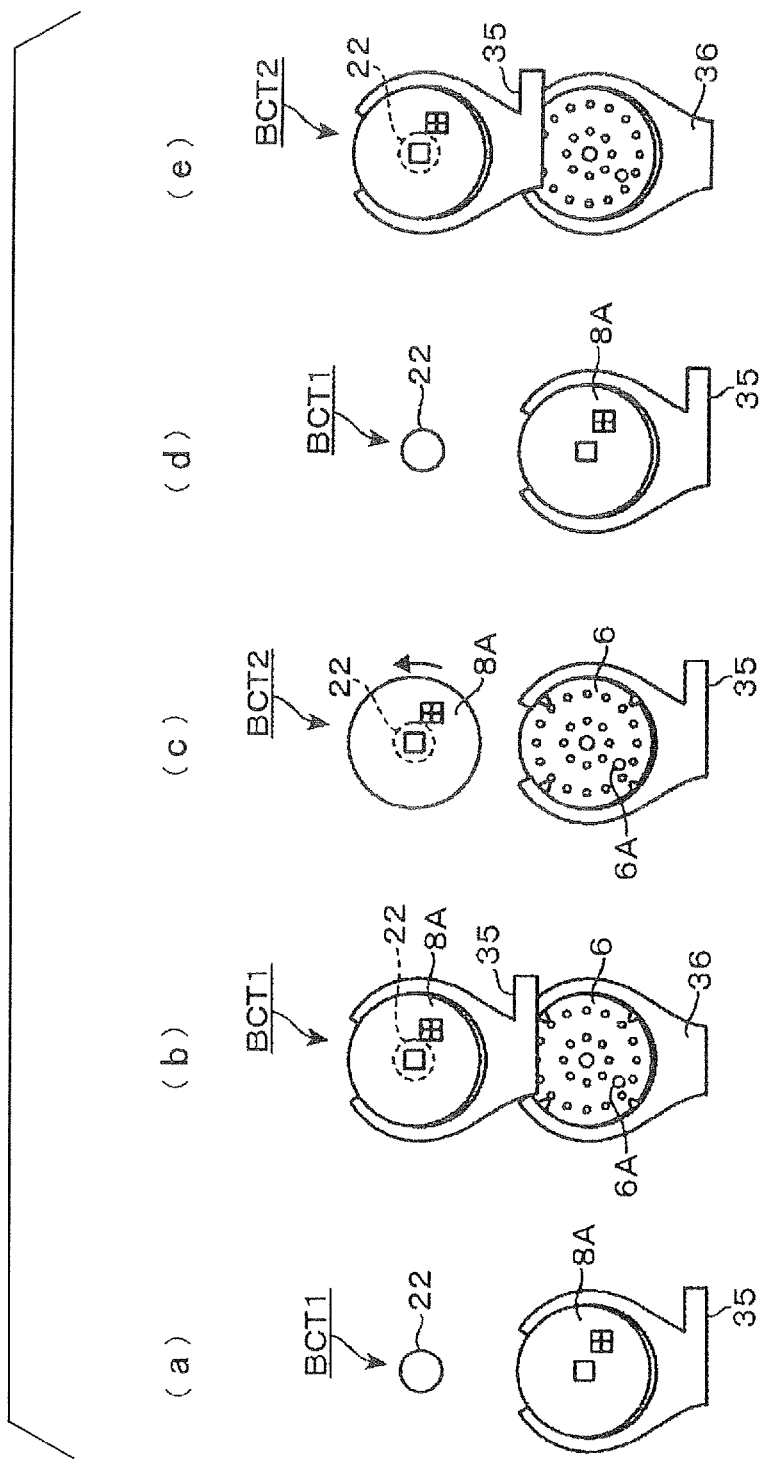
FIG. 19 is a diagram explaining the operations of the transport arm.
Figure 20:
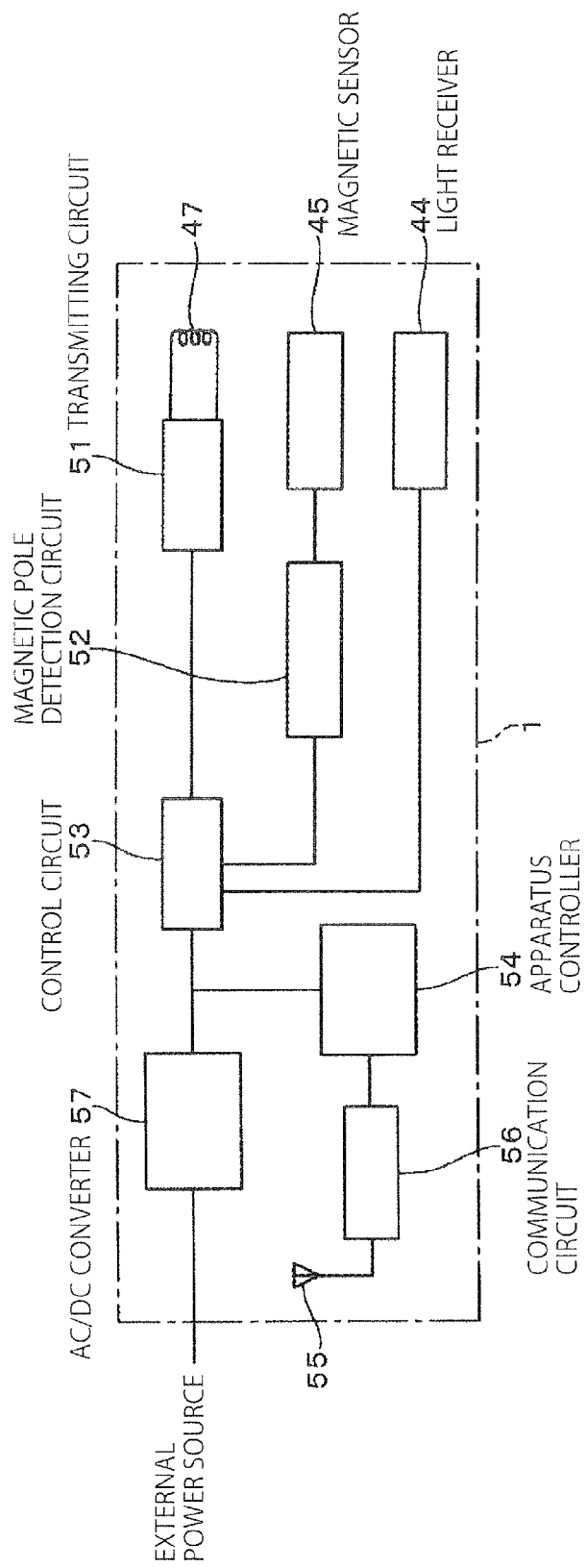
FIG. 20 is a schematic circuit diagram of a coating and developing apparatus in a second embodiment of the present invention.

Step for inspecting each liquid processing module while transporting the charged power feeding wafer 6 and sensor wafer 8A will now be described with reference to the flowchart of FIG. 17, and also to the operation diagrams of the transport arm G2 in FIGS. 18 to 20, in addition to the timing diagram of FIG. 16. The flowchart of FIG. 17 is divided into a left-hand half and a right half by a dotted line. The left half depicts the operation of the power feeding wafer 6, whereas the right half depicts the operation of the sensor wafer 8A. The sensor wafer 8A and the power feeding wafer 6 are transported into the individual layers (BCT, COT, DEV) along a path, along which product wafers W are to be transported. However, the transport of the sensor wafer 8A and power feeding wafer 6 within each layer is different from the transport of product wafers W in that the sensor wafer 8A and power feeding wafer 6 are not transported to the heating modules included in the shelf units U1 to U5, although they are sequentially transported to all the liquid processing modules.

When, for instance, the processing of wafers W is stopped, the user performs a predetermined operation via an operating section (not shown) to instruct data acquisition by the sensor wafer 8A. If, in this instance, the apparatus controller 54 has received the full charge signal from the power feeding wafer 6, a data acquisition operation starts immediately. However, if the full charge signal has not been received, the data acquisition operation will not be started until the full charge signal is received.

First of all, the transfer arm 12 transports the power feeding wafer 6 from the standby module 4 to the transfer module BF1. The lower fork 36 of the transfer arm G2 then receives the power feeding wafer 6 at its advanced position (step S21, FIG. 18(*a*)) and moves to its retracted position (FIG. 18(*b*)). Next, the transfer arm 12 transports the sensor wafer 8A from the standby module 4 to the transfer module BF1. The upper fork 35 of the transfer arm G2 then receives the power feeding wafer 6 at its advanced position (step S22, FIG. 18(*c*)) and moves to its retracted position.

Figure 18:
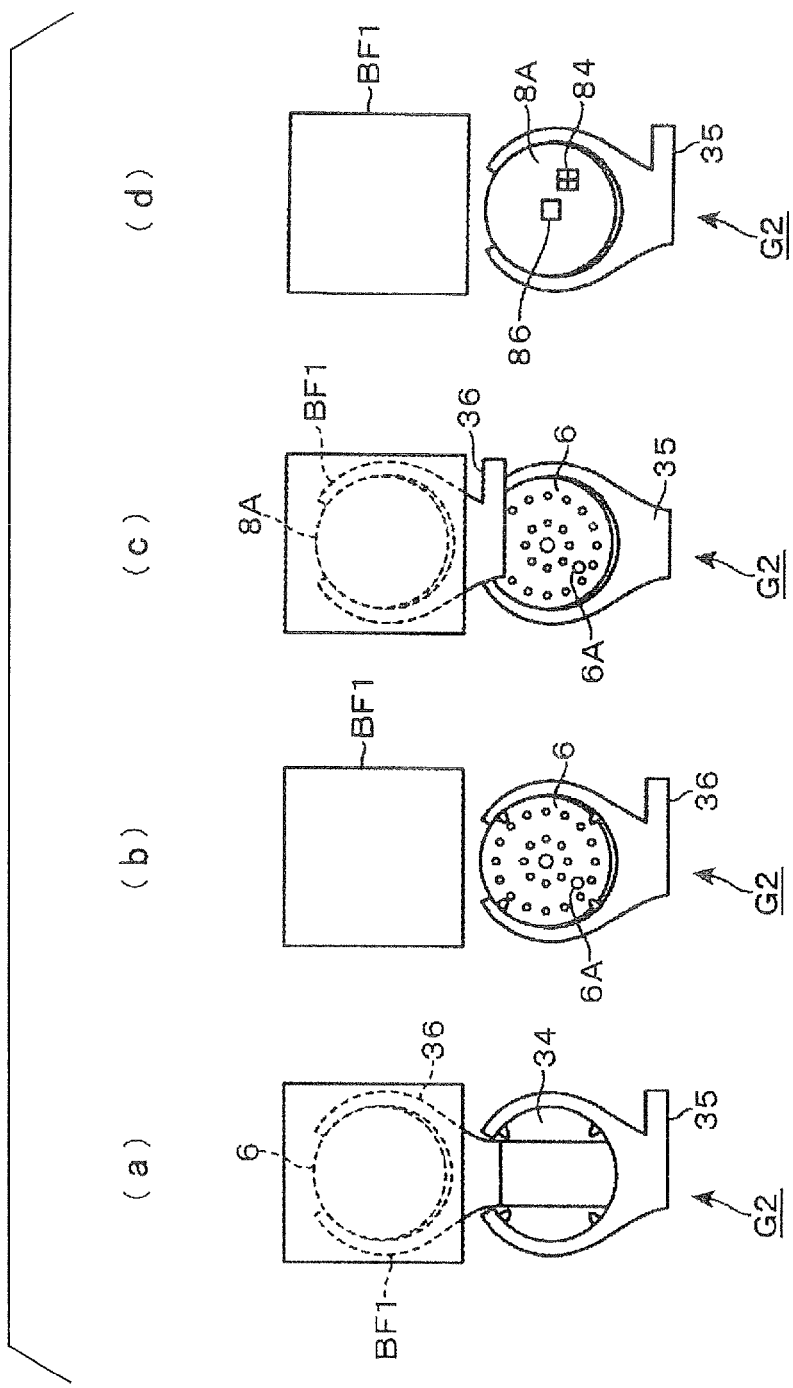
FIG. 18 is a diagram explaining the operation of the transport arm.

When the forks 35, 36 overlap, in other words, the sensor wafer 8 positions above the power feeding wafer 6 (step S23, FIG. 18(*d*)), the magnetic force of the magnet 62 of the power feeding wafer 6 turns ON the magnetic sensors 65 (step S24), the power feeding coil 6A is then connected to the power supply section 70 through the power-transmitting circuit 68 to let the power supply section 70 transmit electric power to the power feeding coil 6A of the power feeding wafer 6 so that a magnetic flux around the power feeding coil 6A is generated (step S25, time t3 in FIG. 16). The base 34 of the transport arm G2 moves from the front of the transfer module BF1 to the front of the antireflective film forming module BCT1 (FIG. 19(*a*)).

As previously described, an electric current is induced in the power receiving coils 82 due to electromagnetic induction, so that the power supply section 90 of the sensor wafer 8A is charged (step S26), and the light emitter 83 of the sensor wafer 8A to emit light (step S27). The emitted light is then received by the light receivers 64 of the power feeding wafer 6. Hence, electric power is continuously transmitted to the power feeding coil 6A.

The charge/discharge control circuit 88 on the sensor wafer 8A judges whether the power supply section 90 is fully charged (step S28). If it is judged that the power supply section 90 is not fully charged, the light emission from the light emitter 83 continues so that the power supply section 90 is continuously charged. If, on the other hand, it is judged that the power supply section 90 is fully charged, the charge/discharge control circuit 88 stops the light emission from the light emitter 83 (step S29). Hence, the light receivers 64 of the power feeding wafer 6 no longer receive light (step S30). The electrode 60 on the power feeding wafer 6 is then connected to the power supply section 70 through the power-receiving circuit 67 to stop the transmission of electric power to the power feeding coil 6A (step S31, time t4 in FIG. 16). The antenna 98 of the sensor wafer 8A outputs a transport allowance signal to the apparatus controller 54 to indicate that the sensor wafer 8A can be transported to a module and used for inspection (step S32).

Upon receipt of the transport allowance signal, the apparatus controller 54 outputs a transport signal. The upper fork 35 then advances to the antireflective film forming module BCT1 and transfers the sensor wafer 8A to the spin chuck 22 (FIG. 19(*b*), time t5 in FIG. 16). The spin chuck 22 rotates at a predetermined angular velocity so that acquired detected data is transmitted to the apparatus controller 54 through the antenna 98 (FIG. 19(*c*)). The apparatus controller 54 then analyzes the data, detects the acceleration to be applied to the acceleration sensor 86A, and computes the eccentric distance between the rotation center of the spin chuck 22 and the rotation center of the sensor wafer 8A based on the acceleration. After stopping the rotation of the spin chuck 22, the upper fork 35 shifts the position of the sensor wafer 8A to conduct an inspection in the same manner again.

After the inspection is repeatedly conducted a predetermined number of times, the apparatus controller 54 identifies the coordinates of the rotation center of the spin chuck 22 based on a plurality of displacement distance data. After completion of inspection (time t6 in FIG. 16), the sensor wafer 8A is transferred to the advanced upper fork 35. The upper fork 35 then retracts so that the sensor wafer 8A overlaps the power feeding wafer 6 (FIG. 19(*d*), time t7 in FIG. 16). While the sensor wafer 8A is being charged as described in steps S24 to S32, the base 34 of the transport arm G2 moves to the front of another antireflective film forming module BCT2. When the sensor wafer 8A is completely charged (time t8 in FIG. 16), the sensor wafer 8A is transferred to the spin chuck 22 of the antireflective film forming module BCT2 (FIG. 19(*e*), time t9 in FIG. 16). Subsequently, the antireflective film forming module BCT2 is inspected in the same manner as for the antireflective film forming module BCT1.

Even after the inspection of the antireflective film forming module BCT2, the sensor wafer 8A is charged by the power feeding wafer 6 and transferred to the next liquid processing module each time the inspection of one liquid processing module is completed. The sensor wafer 8A and the power feeding wafer 6 are then sequentially transported from the BCT layer B2 through the COT layer B3 to the DEV layer B1. When the inspections of all the liquid processing modules are completed, the power feeding wafer 6 is transferred from the lower arm 36 of the transport arm G1 to the transfer module BF7.

Subsequently, the power feeding wafer 6 is transported by the transfer arm 12 to the standby module 4 (time t10 in FIG. 16) and recharged as described in steps S11 to S19. Like the power feeding wafer 6, the sensor wafer 8A is transported from the lower arm 36 of the transport arm G1 through the transfer module BF7 to the standby module 4 to be placed on standby therein. When the product wafer W is transported after completion of inspection, the apparatus controller 54 controls the transport of product wafers W with reference to the coordinates identified during the aforementioned inspection such that the rotation center of the product wafer W coincides with the rotation center of the spin chuck 22.

The sensor wafer 8B is sequentially transported, instead of the liquid processing modules, to the heating modules in the individual layers to acquire data on the wafer heating temperature in the heating modules. The sensor wafer 8C is transported to all wafer processing modules including the liquid processing modules and heating modules to acquire data, for instance, on humidity and wind speed.

In the foregoing first embodiment, the lower fork 36 holds the power feeding wafer 6, electric power is supplied from the power feeding wafer 6 to the sensor wafer 8A to charge the sensor wafer 8A each time the inspection in a liquid processing module is completed. Therefore, the capacity of the power supply section 90 mounted on the sensor wafer 8A may be small. This makes it possible to suppress an increase in the weight and thickness of the sensor wafer 8A. Thus, the acceleration detected during inspection in a liquid processing module can be made close to the acceleration during actual processing of a wafer W. Therefore, highly accurate inspection data can be obtained. Further, since the sensor wafers can be automatically transported by the transport arms G, the inspection data can be acquired with high efficiency.

Furthermore, the weight and thickness of the sensor wafers can be made close to those of the product wafer. Therefore, when the changes of wafer temperature are measured by the sensor wafer 8B, data close to the changes of temperature of the product wafer W can be acquired. Moreover, the thickness of the sensor wafers can be made close to that of the product wafer. Therefore, the atmosphere in which a module is placed when the sensor wafer 8C is loaded into the module can be made close to the atmosphere prevailing when the product wafer W is loaded. This makes it possible to accurately measure the humidity and wind speed in the module.

In the present embodiment, a sensor wafer 8 is transported to a module after the power supply section 90 of the sensor wafer 8 is fully charged. Thus, reduction of data accuracy, due to decreasing of the remaining amount of electric power in the power supply section 90 during data acquisition in a module, can be prevented.

Further, in the present embodiment, the power supply sections 70, 90 of the sensor wafer 8 and power feeding wafer 6 need not be removed from the wafers for charging them. Since the power supply sections 70, 90 can be automatically charged, the efficiency of inspection can be enhanced. Furthermore, since the electric double-layer capacitors 84, which constitute the power supply sections 70, 90, can perform charging/discharging operations at a high speed, the time required for inspection can be advantageously reduced. The electric double-layer capacitors 84 are advantageous in that they can be handled with ease because they are less likely to incur liquid leakage due to centrifugal force while they are rotated by the spin chuck 22, as compared with chemically reactive batteries such as lithium-ion secondary batteries.

In the present embodiment, the sensor wafer 8A is charged each time a liquid processing module is inspected. Alternatively, the sensor wafer 8A may be charged a plurality of number of times each time a liquid processing module is inspected. For example, the charging operation may be such that the upper fork 35 receives the sensor wafer 8A in order to shift the position of the sensor wafer 8A relative to the spin chuck 22, the upper fork 35 retracts to charge the sensor wafer 8A, and then the upper fork 35 transfers the sensor wafer 8A back to the spin chuck. In this case, the weight of the sensor wafer 8A can advantageously be further reduced.

Second Embodiment

A second embodiment of the present invention will now be described primarily with reference to its difference from the first embodiment. In the second embodiment, the sensor wafers 8 are transported by the lower fork 36. The sensor wafers 8 supported by the lower fork 36 come close to the base 34, and the base 34 for a transport arm charges the sensor wafers 8 by electromagnetic induction. FIG. 20 schematically shows the configuration of a portion related to the data acquisition method of the coating and developing apparatus 1 in the second embodiment. The schematically depicted configuration in the second embodiment is the same as that in the first embodiment except that, instead of the power feeding pin 48, a power feeding coil 47 is connected to the power transmission circuit. The power feeding coil 47 has the same configuration as the power feeding coil 6A in the first embodiment.

Figure 21:
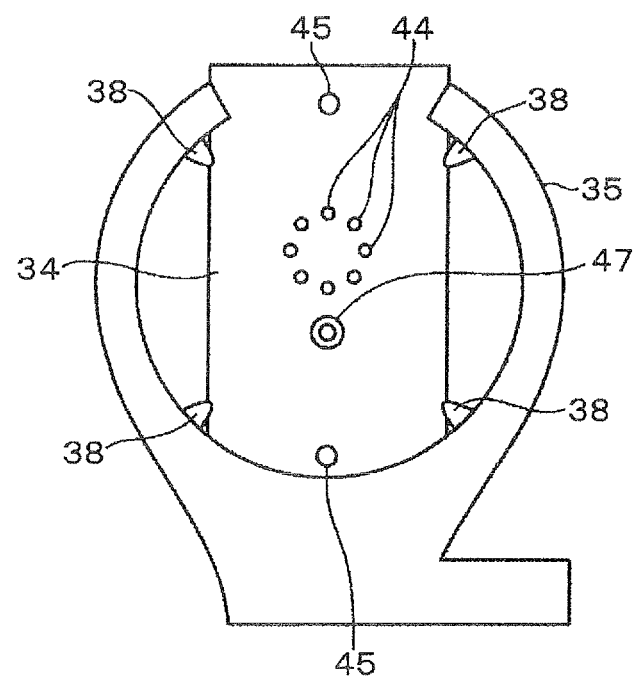
FIG. 21 is a plan view of the transport arm in the second embodiment.
Figure 22:
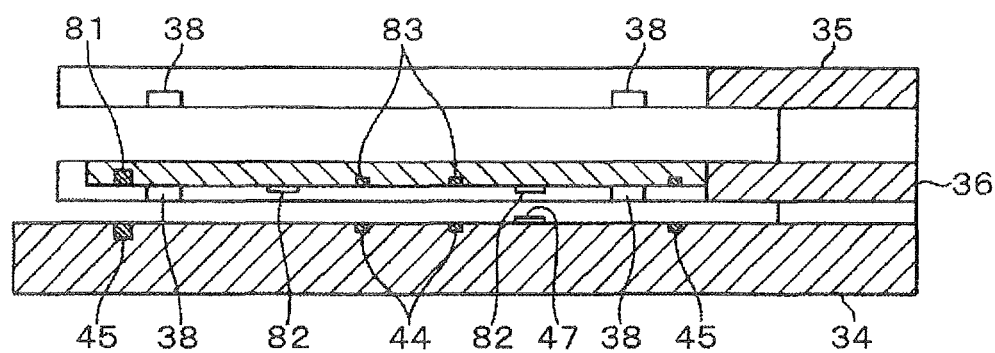
FIG. 22 is a side view of the transport arm in the second embodiment.

FIG. 21 shows the base 34 for the transport arm G2. The light receiver 44, the magnetic sensors 45, and the power feeding coil 47, which are disposed in the standby module 4 in the first embodiment, are disposed on the base 34. When the lower fork 36 is in its retracted position as shown in FIG. 22, the light receiver 44 receives light emitted from the light emitter 83 of the sensor wafers 8. Further, when the lower fork 36 is in its retracted position, the power receiving coils 82 of the sensor wafers 8 are positioned above the power feeding coil 47 so that the sensor wafer 8A can be charged by electromagnetic induction between the power feeding coil 47 and the power receiving coils 82. Further, when the lower fork 36 is in its retracted position, each magnetic sensor 45 can detect the magnetic force of the magnet 81 on the sensor wafers 8. In this instance, the power feeding coil 47 functions as a second power supply section that supplies electric power to the power-receiving coils.

In the second embodiment, when the lower fork 36 at its advanced position receives a sensor wafer 8 from a module and moves to its retracted position, each magnetic sensor 45 on the base 34 turns ON so that the sensor wafer 8 is charged in the same manner as described in steps S25 to S32. Thus, the second embodiment achieves essentially the same advantages as the first embodiment. However, the first embodiment is more advantageous in that the increasing in size and troublesome maintenance work of the transport arms G can be avoided, since the transport arms G need not to include a coil or other power feeder for feeding electric power to the magnetic sensors and to the sensor wafers 8.

Third Embodiment

Figure 23:
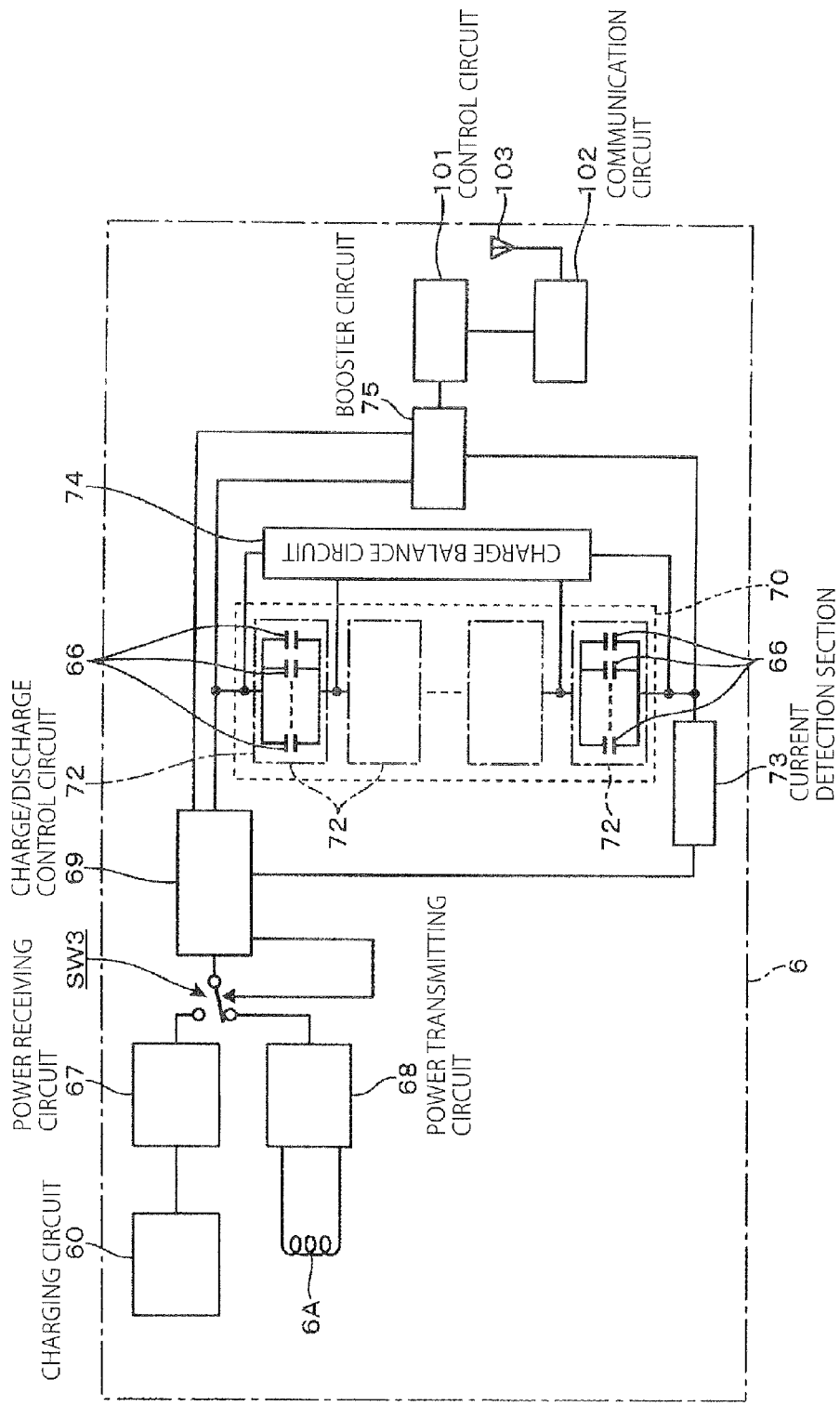
FIG. 23 is a schematic circuit diagram of the power feeding wafer in a third embodiment of the present invention.

A third embodiment of the present invention will now be described primarily with reference to its difference from the first embodiment. FIG. 23 is a schematic circuit diagram of the power feeding wafer 6 according to the third embodiment. In the third embodiment, the light receivers 64 and the light emitter 63 are omitted, because the timing at which the power feed to the sensor wafers 8 is continued and stopped is controlled wirelessly. Instead, a communication circuit 102 is provided downstream of the power supply section 70 via a control circuit 101. An antenna 103 is connected to the communication circuit 102. Although not shown in the drawings, the sensor wafers 8 are not provided with the light emitters 83, which make pairs with the light receivers 64.

A drive control section (not shown) for the upper fork 35 and lower fork 36 of the transport arms G outputs a position signal, indicating the fork positions with respect to the base 34, to the apparatus controller 54. In the third embodiment, the timing at which the charging of the sensor wafers 8 starts is controlled not based on the magnetic force of the sensor wafers 8 but based on the position signals from the forks 35, 36.

The difference in the charging of the sensor wafers 8 by the power feeding wafer 6 between the third and first embodiments will now be described. When the upper fork 35 receives the sensor wafer 8A and moves to its retracted position, a position signal indicative of such a movement of the upper fork 35 is output from the upper fork 35 and received by the apparatus controller 54. A signal specifying the start of charging is then wirelessly transmitted to the antenna 103 of the power feeding wafer 6 through the antenna 55 of the coating and developing apparatus 1, so that charging of the sensor wafers 8 from the power feeding wafer 6 starts. When fully charged, the sensor wafers 8 wirelessly transmit a charge stop signal to the antenna 103 through the antenna 98, so that charging from the power feeding wafer 6 stops.

Also, in a case where the standby module 4 charges the power feeding wafer 6, wireless communications may be used to control continuing and stopping of the charging operation, like the case where the power feeding wafer 6 charges the sensor wafers 8. For example, a drive control section (not shown) for the transfer arm 12 may output a position signal indicating the position of the transfer arm 12, so that the standby module 4 starts charging the power feeding wafer 6 when the power feeding wafer 6 is loaded into the standby module 4. The third embodiment advantageous in that it does not require a magnet, a magnetic sensor, a light receiver, and a light emitter and simplifies the structures of the standby module, power feeding wafer, and sensor wafers. However, the first embodiment provided with a magnet and magnetic sensors is advantageous in that it can avoid an unnecessary power supply to the primary coil and to the power feeding pin 48 when a wafer W falls off from the transport arm G or the transfer arm 12. It should also be noted that the second embodiment may control the start of charging based on the position signal of the transfer arm, like the third embodiment.

In the foregoing embodiments, an optical sensor is used to control the timing at which the charging of the sensor wafers 8 stops, but the timing control is not limited thereto. For example, the power feeding wafer 6 may include: a load detection circuit that detects a load that is imposed when electric power is supplied to the sensor wafers 8; and a judgment circuit that judges, based on the load detected by the load detection circuit, whether the power supply section 90 of the sensor wafers 8 is fully charged, so that continuing or stopping the power feed to the sensor wafers 8 is judged based on the judgment result of the judgment circuit. Further, the time period of charging the sensor wafers 8 may be controlled by using a timer, provided in power feeding wafer 6, which automatically stops the charging operation when a predetermined period of time elapses after the start of the charging operation.

In the foregoing embodiments, the rechargeable electricity storage sections that constitute the power supply sections 70, 90 may employ a secondary battery, such as a lithium-ion secondary battery, in place of an electric double-layer capacitor. However, such a secondary battery stores electric energy after converting it to chemical energy through a chemical reaction, whereas the electric double-layer capacitor stores electricity in the form of an electrical charge. Hence, the electric double-layer capacitor rapidly stores and discharges electrical energy. Therefore, it is preferred that the electricity storage section be formed by the electric double-layer capacitor in order to enhance the efficiency of data acquisition. Not only electric double-layer capacitors but also nano-hybrid capacitors and lithium-ion capacitors can be preferably used as the electricity storage section because they store electricity in the form of an electric charge. Further, in the foregoing embodiments, non-contact power feed is provided from the power transmitting side to the power receiving side by using electromagnetic induction. Alternatively, magnetic field resonance or electric field resonance may be used for non-contact power feed. In addition, non-contact power feed may also be provided by using electromagnetic wave power transmission.

As the power receiving coils 82 and power feeding coil 6A, cylindrical coils whose axes extend in the wafer thickness direction may be used instead of the aforementioned planar coils. However, the use of the planar coils is more advantageous than the cylindrical coils because the former makes it possible to reduce the thickness of the power feeding wafer 6A and the sensor wafers 8, and to minimize positional displacement because the planar coils have less air resistance during transport than the cylindrical coils.

Figure 24:
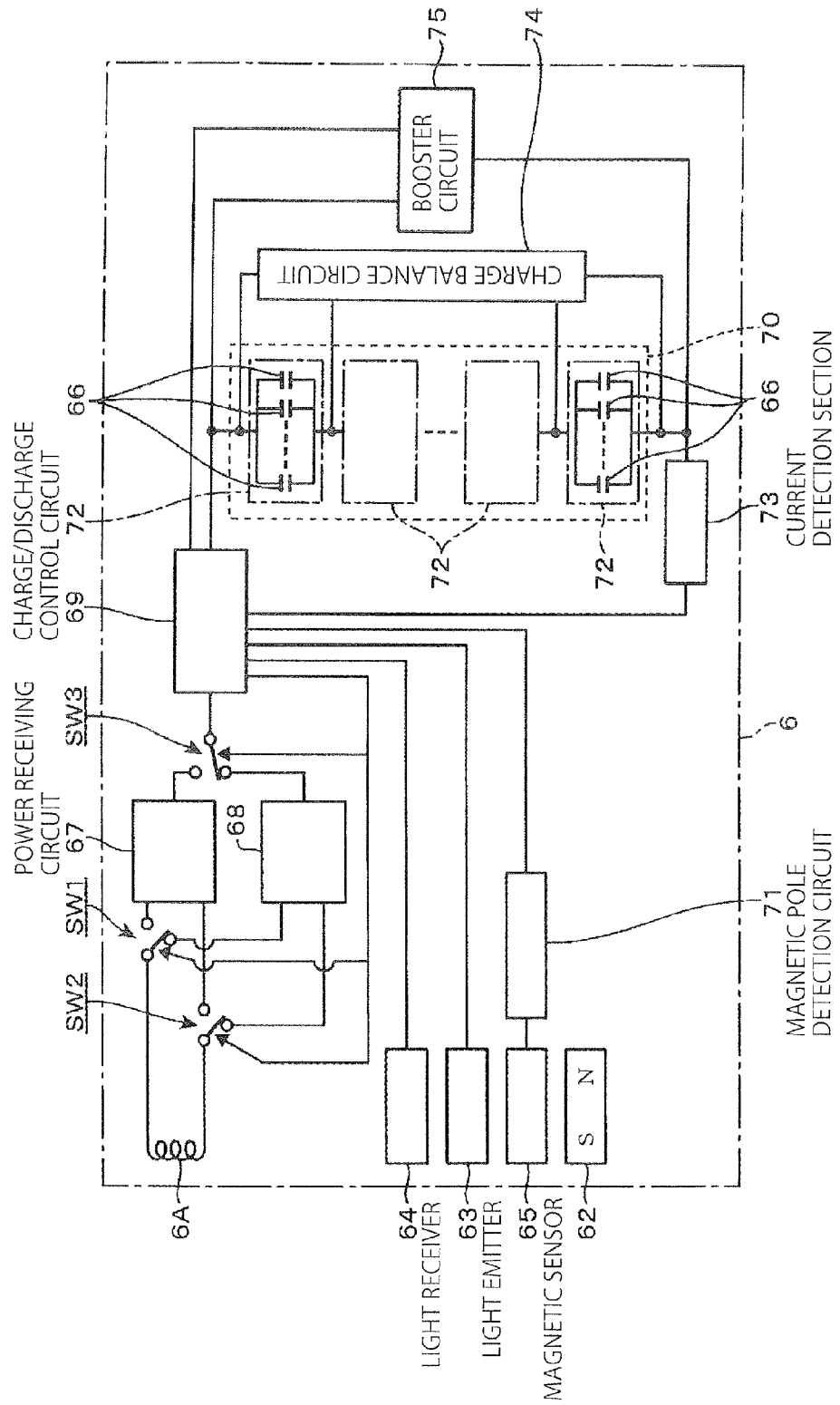
FIG. 24 is a schematic circuit diagram of another power feeding wafer.

Moreover, non-contact power feed may be provided from the standby module 4 to the power feeding wafer 6. FIG. 24 is a schematic diagram of the power feeding wafer 6 that is configured to provide such non-contact power feed. The power feeding wafer 6 configured as shown in FIG. 24 differs from the power feeding wafer 6 of the first embodiment in that switches SW1, SW2 are disposed between the power feeding coil 6A and the power receiving and power transmitting circuits 67, 68.

When the power supply section 70 is to be charged, the switches SW1 to SW3 are switched such that the power feeding coil 6A is connected to the charge/discharge control circuit 69 through the power receiving circuit 67 and is not connected to the power transmitting circuit 68. When the sensor wafers 8 are to be charged, the switches SW1 to SW3 are switched such that the power feeding coil 6A is connected to the charge/discharge control circuit 69 through the power transmitting circuit 68 and not connected to the power receiving circuit 67. The switches are switched by the charge/discharge control circuit 69. For example, the power feeding coil 47 in the second embodiment is disposed in the standby module 4 to provide non-contact power feed from the power feeding coil 47 to the power feeding coil 6A. In this example, the power feeding coil 6A functions as a secondary coil when the power feeding wafer 6 is to be charged, and functions as a primary coil when the sensor wafers 8 are to be charged.

The invention claimed is:

1. A method of acquiring data in a substrate processing apparatus including a carrier block to which a carrier storing therein a plurality of substrates is carried, a plurality of processing modules that process substrates which are carried therein from the carrier block, and a substrate transport mechanism that transports the substrates between the processing modules, the substrate transport mechanism having a base and a first holding member mounted to the base to advance and retract, said method comprising:
holding a sensor substrate by the first holding member, the sensor substrate having a sensor section for acquiring data on the processing modules and a first power supply section with a rechargeable electricity storage section for supplying electric power to the sensor section;
advancing the first holding member to transfer the sensor substrate to a processing module;
acquiring data on the processing module by the sensor section of the sensor substrate; and
causing the first holding member to receive the sensor substrate, whose electric charge is consumed, from the processing module and retract, and charging the first power supply section of the sensor substrate in a non-contact manner by a second power supply section that moves together with the base while the first holding member holding the substrate is in its retracted position.

2. The method according to claim 1, wherein the electricity storage section is constituted by an electric double-layer capacitor.

3. The method according to claim 1, wherein the electricity storage section is constituted by a nano-hybrid capacitor.

4. The method according to claim 1, wherein the electricity storage section is constituted by a lithium-ion capacitor.

5. The method according to claim 1, wherein:
the substrate transport mechanism has a second holding member provided to hold a substrate and configured to advance and retract with respect to the base; and
the second power supply section is provided in a power feeding substrate that charges the first power supply section and that is held by the second holding member.

6. The method according to claim 5, wherein the charging the first power supply section of the sensor substrate includes charging the sensor substrate while the sensor substrate is positioned relative to a power feeding substrate in such a way that a power receiving coil, connected to a circuit for charging the first power supply section, provided in the sensor substrate and a power receiving coil provided in the power feeding substrate face each other.

7. The method according to claim 1, wherein the second power supply section is provided in the base.

8. The method according to claim 1, further comprising judging whether the sensor substrate held by a first substrate holding part is placed at a charging position at which the sensor substrate is to be charged by the second power supply section.

9. The method according to claim 1, further comprising:
judging whether an amount of charge in the first power supply section is reached a predefined set value; and
stopping charging of the first power supply section when the amount of charge in the first power supply section is reached the predefined set value.

10. The method according to claim 9,
wherein the sensor substrate is provided with a light emitter that emits light by using electric power of the first power supply section,
said method further comprising stopping emitting light from the light emitter when the amount of charge in the first power supply section is reached the predefined set value,
wherein the base or the power feeding substrate is provided with a light receiver and paired with the light emitter,
said method further comprising receiving light from the light emitter by the light receiver, and wherein judgment whether or not the amount of charge in the first power supply section is reached the predefined set value is performed based on light reception of the light receiver.

11. The method according to claim 1,
wherein the substrate processing apparatus is provided with a charging mechanism to charge the second power supply section,
said method further comprising charging the second power supply section by the charging mechanism in a non-contact manner.

12. The method according to claim 1, wherein the sensor substrate includes a wireless transmission section that receives electric power supplied from the first power supply section, and wherein the wireless transmission section transmits data on the processing module to a receiving section of the substrate processing apparatus.

13. A sensor substrate configured to be transported by a substrate transport device, the sensor substrate comprising:
a sensor section that acquires data on a processing module;
a transmission section that wirelessly transmits the data acquired by the sensor section;
a power supply section having a rechargeable electricity storage section for supplying electric power to the sensor section and to the transmission section; and
a plurality of power receiving coils that are connected to a circuit of the power supply section to receive electric power transmitted from outside and supply the electric power to the electricity storage section,
wherein the power receiving coils are disposed along a flat surface of the sensor substrate to form a circumferential array.

14. The sensor substrate according to claim 13, wherein the electricity storage section is constituted by an electric double-layer capacitor.

15. The sensor substrate according to claim 13, wherein the electricity storage section is constituted by a nano-hybrid capacitor.

16. The sensor substrate according to claim 13, wherein the electricity storage section is constituted by a lithium-ion capacitor.

17. The sensor substrate according to any one of claims 13 to 16, further comprising:
a detection section that detects a voltage of the power supply section or an electrical current flowing from the power supply section; and
an output section that outputs a charge completion detection signal based on a detection result of by the detection section.

18. A substrate processing system comprising:
a plurality of processing modules that each processes a substrate;
a substrate transport device that transports the substrate between the processing modules, the substrate transport device having a base and a first holding member mounted to the base so as to advance and retract with respect to the base; and
a sensor substrate which is to be transported by the substrate transport device to acquire measurement data,
wherein the sensor substrate includes:
a sensor section that acquires data related to processing conditions conducted in each processing module;
a transmission section that transmits the data acquired by the sensor section in a wireless manner;
a first power supply section having a rechargeable electricity storage section for supplying electric power to the sensor section and to the transmission section; and
a plurality of power receiving coils that are connected to a circuit of the first power supply section to receive electric power transmitted in non-contact manner from a second power supply section which is moved together with the base, and to supply the received electric power to the electricity storage section,
wherein the plurality of power receiving coils are disposed along a flat surface of the sensor substrate, and
wherein the substrate transport device has a movable holding member, for holding the sensor substrate, that can be moved between an advanced position with respect to the base at which the holding member receives from one of the processing modules the sensor substrate having the electricity storage section whose electricity has been consumed, and a retracted position with respect to the base at which the electricity storage section is charged using the power receiving coils during transporting of the sensor substrate from the one processing module to another processing module.

19. The substrate processing system according to claim 18, wherein the electricity storage section is constituted by an electric double-layer capacitor.

20. The substrate processing system according to claim 18, wherein the sensor substrate further includes:
a detection section that detects a voltage of the first power supply section or an electrical current flowing from the first power supply section; and
an output section that outputs a charge completion detection signal based on a detection result of the detection section.

* * * * *